US012604485B2

(12) United States Patent
Pirovano et al.

(10) Patent No.: US 12,604,485 B2
(45) Date of Patent: *Apr. 14, 2026

(54) CROSS POINT ARRAY ARCHITECTURE FOR MULTIPLE DECKS

(71) Applicant: Micron Technology, Inc., Boise, ID (US)

(72) Inventors: Agostino Pirovano, Milan (IT); Lorenzo Fratin, Buccinasco (IT)

(73) Assignee: Micron Technology, Inc., Boise, ID (US)

( * ) Notice: Subject to any disclaimer, the term of this patent is extended or adjusted under 35 U.S.C. 154(b) by 114 days.

This patent is subject to a terminal disclaimer.

(21) Appl. No.: 18/416,763

(22) Filed: Jan. 18, 2024

(65) Prior Publication Data

US 2024/0268127 A1 Aug. 8, 2024

Related U.S. Application Data

(63) Continuation of application No. 17/499,707, filed on Oct. 12, 2021, now Pat. No. 11,895,851.

(51) Int. Cl.
*H10B 63/00* (2023.01)
*G11C 13/00* (2006.01)

(52) U.S. Cl.
CPC ......... *H10B 63/84* (2023.02); *G11C 13/0004* (2013.01); *G11C 13/0026* (2013.01); (Continued)

(58) Field of Classification Search
CPC ........ H10B 63/84; H10B 63/24; H10B 63/10; G11C 13/0004; G11C 13/0026; (Continued)

(56) References Cited

U.S. PATENT DOCUMENTS 11,895,851 B2 * 2/2024 Pirovano ........... G11C 13/0026
2008/0025132 A1 1/2008 Fasoli et al.
(Continued)

FOREIGN PATENT DOCUMENTS

CN 108806746 A 11/2018
CN 112166471 A 1/2021
(Continued)

OTHER PUBLICATIONS

"International Search Report and Written Opinion of the International Searching Authority," issued in connection with Int'l Appl. No. PCT/US2022/077576, dated Jan. 20, 2023 (10 pages).
(Continued)

*Primary Examiner* — Fernando Hidalgo
(74) *Attorney, Agent, or Firm* — Holland & Hart LLP

(57) ABSTRACT

Methods, systems, and devices for cross point array architecture for multiple decks are described. A memory array may include multiple decks, such as six or eight decks. The memory array may also include sockets for coupling access lines with associated decoders. The sockets may be included in sub-blocks of the array. A sub-block may be configured to include sockets for multiple access lines. A socket may intersect an access line in the middle of the access line, or at an end of the access line. Sub-blocks containing sockets for an access line may be separated by a period based on the access line.

20 Claims, 13 Drawing Sheets

(52) U.S. Cl.
CPC ........ *G11C 13/0028* (2013.01); *G11C 13/003*
(2013.01); *G11C 2213/71* (2013.01)

(58) Field of Classification Search
CPC .............. G11C 13/0028; G11C 13/003; G11C
2213/71; G11C 8/14; G11C 7/18; G11C
5/025; G11C 2213/76; H10N 70/20;
H10N 70/231; H10N 70/826; H10N
70/8825
USPC ......................................................... 365/163
See application file for complete search history.

(56) References Cited

U.S. PATENT DOCUMENTS

| | | | |
|---|---|---|---|
| 2011/0205809 | A1 | 8/2011 | Sutardja |
| 2014/0104938 | A1 | 4/2014 | Castro et al. |
| 2015/0054160 | A1 | 2/2015 | Liu |
| 2016/0133300 | A1 | 5/2016 | Pellizzer et al. |
| 2017/0256590 | A1 | 9/2017 | Sumino |
| 2018/0374902 | A1 | 12/2018 | Castro |
| 2019/0036022 | A1 | 1/2019 | Pirovano et al. |
| 2020/0194038 | A1 | 6/2020 | Castro et al. |
| 2020/0381046 | A1 | 12/2020 | Redaelli et al. |
| 2021/0151105 | A1 | 5/2021 | Majumdar et al. |
| 2021/0241828 | A1 | 8/2021 | Banerjee et al. |
| 2021/0264956 | A1 | 8/2021 | Redaelli et al. |
| 2022/0285350 | A1 | 9/2022 | Okajima et al. |

FOREIGN PATENT DOCUMENTS

| | | |
|---|---|---|
| CN | 113169171 A | 7/2021 |
| KR | 10-2020-0074837 A | 6/2020 |
| TW | 202127673 A | 7/2021 |

OTHER PUBLICATIONS

Taiwanese Patent Office, "Office Action," issued in connection with Taiwanese Patent Application No. 111137663 dated Sep. 13, 2023 (11 pages total. 7 pages English machine translation and 4 pages Original).

Chinese patent office, "China Office Action," issued in connection with China Patent Application No. 202280074585.4 dated May 1, 2025 (7 pages) (2 pages of English Translation and 5 pages of Original Document).

European Patent Office, "Extended Search Report," issued in connection with European Patent Application No. 22881914.0 dated Dec. 2, 2024 (5 pages).

* cited by examiner

Memory Cell Manager

1125

Decoder Manager

1130

1120

1100

Figure 12:
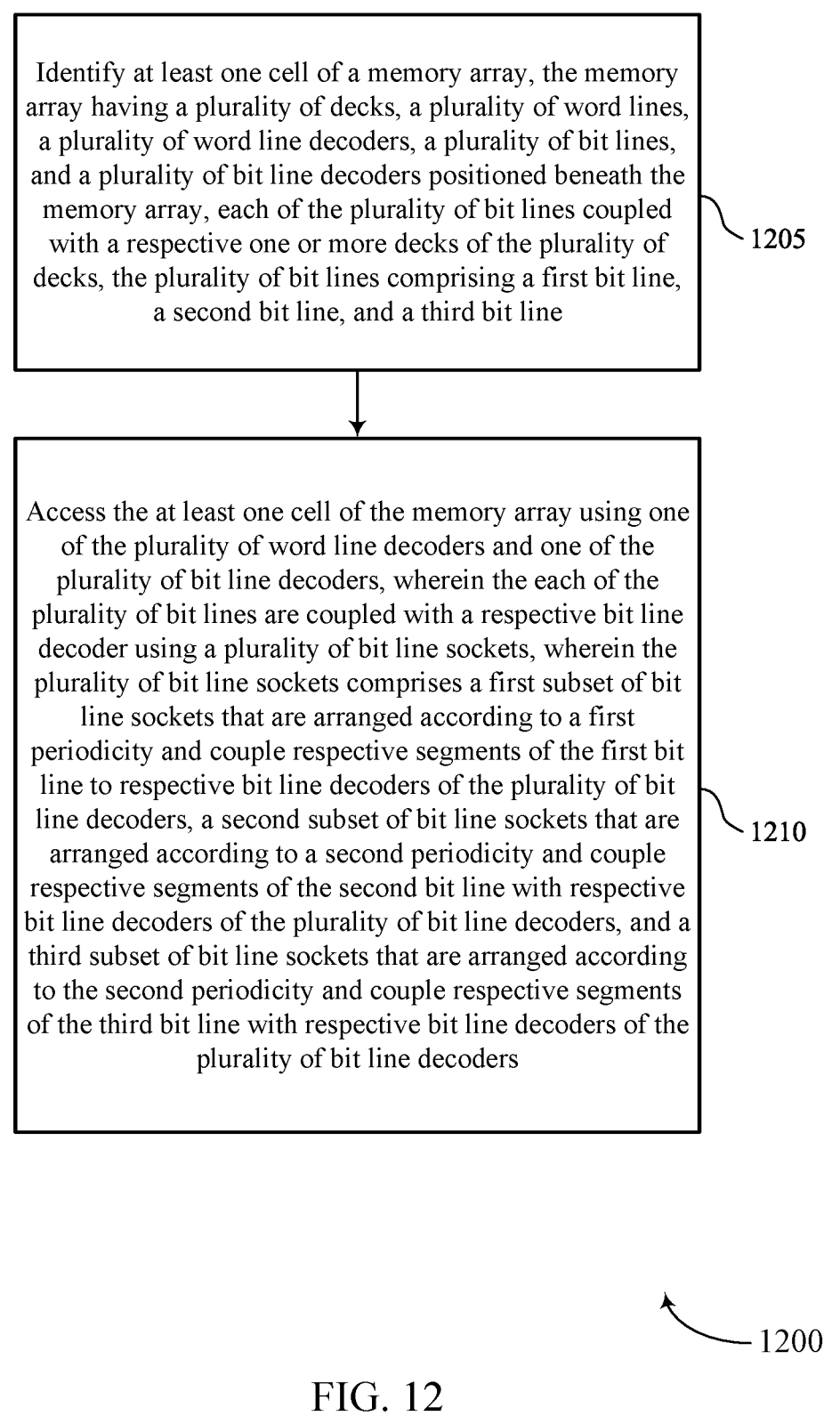

Identify at least one cell of a memory array, the memory array having a plurality of decks, a plurality of word lines, a plurality of word line decoders, a plurality of bit lines, and a plurality of bit line decoders positioned beneath the memory array, each of the plurality of bit lines coupled with a respective one or more decks of the plurality of decks, the plurality of bit lines comprising a first bit line, a second bit line, and a third bit line

1205

Access the at least one cell of the memory array using one of the plurality of word line decoders and one of the plurality of bit line decoders, wherein the each of the plurality of bit lines are coupled with a respective bit line decoder using a plurality of bit line sockets, wherein the plurality of bit line sockets comprises a first subset of bit line sockets that are arranged according to a first periodicity and couple respective segments of the first bit line to respective bit line decoders of the plurality of bit line decoders, a second subset of bit line sockets that are arranged according to a second periodicity and couple respective segments of the second bit line with respective bit line decoders of the plurality of bit line decoders, and a third subset of bit line sockets that are arranged according to the second periodicity and couple respective segments of the third bit line with respective bit line decoders of the plurality of bit line decoders

Figure 13:
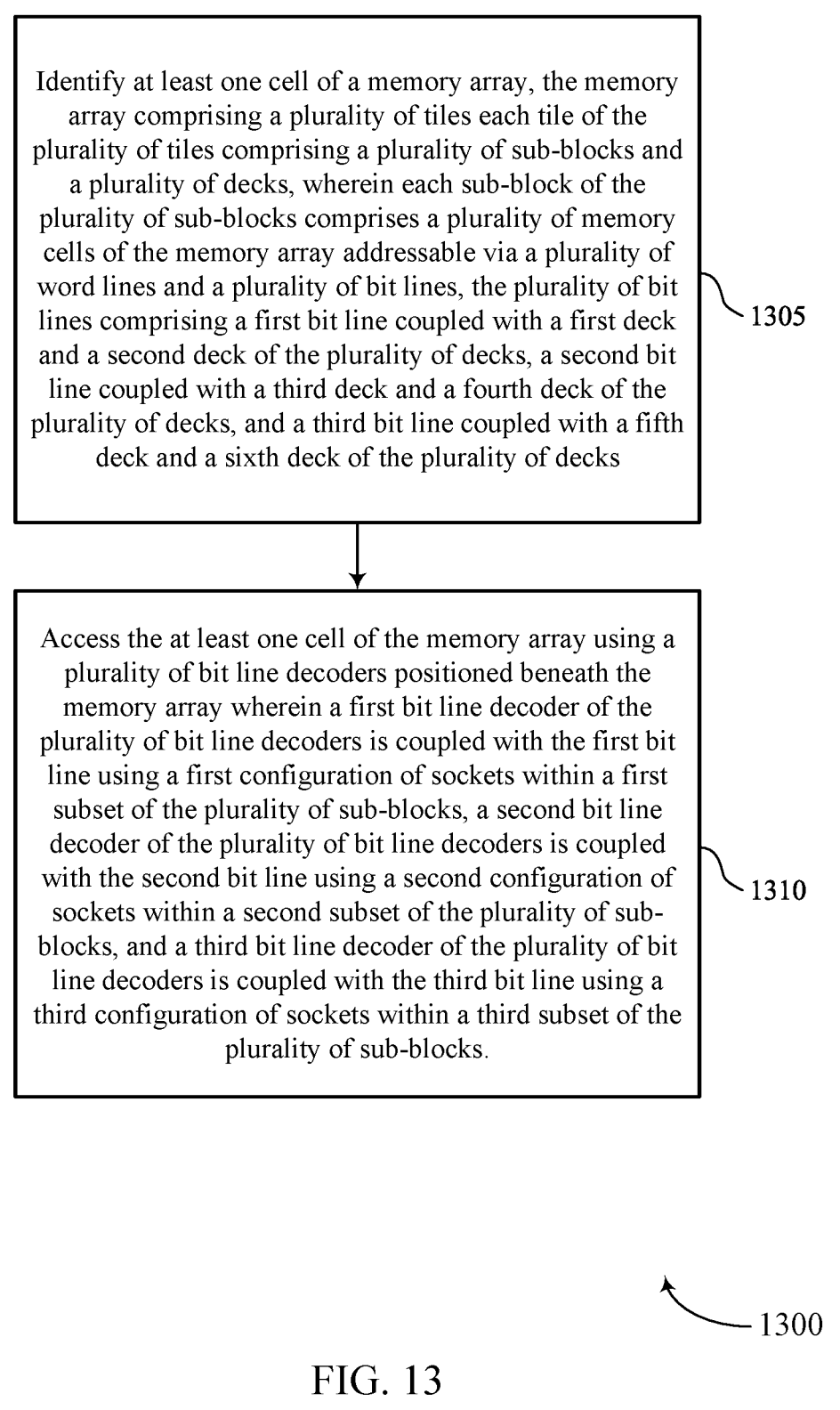

Identify at least one cell of a memory array, the memory array comprising a plurality of tiles each tile of the plurality of tiles comprising a plurality of sub-blocks and a plurality of decks, wherein each sub-block of the plurality of sub-blocks comprises a plurality of memory cells of the memory array addressable via a plurality of word lines and a plurality of bit lines, the plurality of bit lines comprising a first bit line coupled with a first deck and a second deck of the plurality of decks, a second bit line coupled with a third deck and a fourth deck of the plurality of decks, and a third bit line coupled with a fifth deck and a sixth deck of the plurality of decks

1305

Access the at least one cell of the memory array using a plurality of bit line decoders positioned beneath the memory array wherein a first bit line decoder of the plurality of bit line decoders is coupled with the first bit line using a first configuration of sockets within a first subset of the plurality of sub-blocks, a second bit line decoder of the plurality of bit line decoders is coupled with the second bit line using a second configuration of sockets within a second subset of the plurality of sub-blocks, and a third bit line decoder of the plurality of bit line decoders is coupled with the third bit line using a third configuration of sockets within a third subset of the plurality of sub-blocks.

CROSS POINT ARRAY ARCHITECTURE FOR MULTIPLE DECKS

CROSS REFERENCE

The present Application for Patent is a continuation of U.S. patent application Ser. No. 17/499,707 by Pirovano et al., entitled "CROSS POINT ARRAY ARCHITECTURE FOR MULTIPLE DECKS," filed Oct. 12, 2021, assigned to the assignee hereof, and is expressly incorporated by reference in its entirety herein.

FIELD OF TECHNOLOGY

The following relates generally to one or more systems for memory and more specifically to cross point array architecture for multiple decks.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

BRIEF DESCRIPTION OF THE DRAWINGS

FIGS. 12 and 13 show flowcharts illustrating a method or methods that support cross point array architecture for multiple decks in accordance with examples as disclosed herein.

DETAILED DESCRIPTION

Some memory systems, such as cross-point type memory systems, may include more than four decks, such as cross-point memory systems using six or eight decks. However, yield impacts the commercial viability of increasing the number of decks. As yield improves and substrate costs increase, the added cost of including more than four decks may justify the increase in memory cell density. Memory systems including more than four decks may use an increased quantity of decoders used to access and decode additional access lines, such as bit lines. Including the additional access lines may be challenging, as arrangements of sockets coupling the access lines with respective decoders may become complex. A socket may include one or more vias which run vertically through the decks to couple access lines to decoders positioned below the memory array. Techniques to efficiently couple access lines to decoders in cross-point type systems that include more than four decks are desired.

The present disclosure describes a cross-point type memory system that supports more than four decks using novel socket configurations. For example, a memory array of the memory system may be divided into a grid of sub-blocks. Each sub-block may contain sockets for one or more access lines in multiple layers of the memory array (e.g., a sub-block may contain a single socket for a first bit line, or the sub-block may contain sockets for the first bit line and a second bit line). Additionally or alternatively, a sub-block may not contain any sockets. Sub-blocks may be arranged according to one or more periods. For example, sub-blocks containing sockets for a first access line may be arranged according to a first period, while sub-blocks containing sockets for a second access line may be arranged according to a second period.

Additionally or alternatively, a socket coupling an access line to an associated driver may intersect the access line in the middle of the access line or at an end of the access line. As used herein, a socket located at the end of an access line segment may not mean that the socket lies at the physical end of the segment, but that no memory devices are coupled to the segment on the other side of the socket. Similarly, a socket located in the middle of an access line segment may not mean that the socket lies at the center of the segment, but that at least one memory devices is coupled to the segment on both sides of the socket.

Features of the disclosure are initially described in the context of memory systems, dies, and arrays as described with reference to FIGS. 1-3. Features of the disclosure are described in the context of a set of decks and top-down views of memory arrays as described with reference to FIGS. 4-9. These and other features of the disclosure are further illustrated by and described with reference to an apparatus diagram and flowcharts that relate to cross point array architecture for multiple decks as described with references to FIGS. 10-13.

Figure 1:
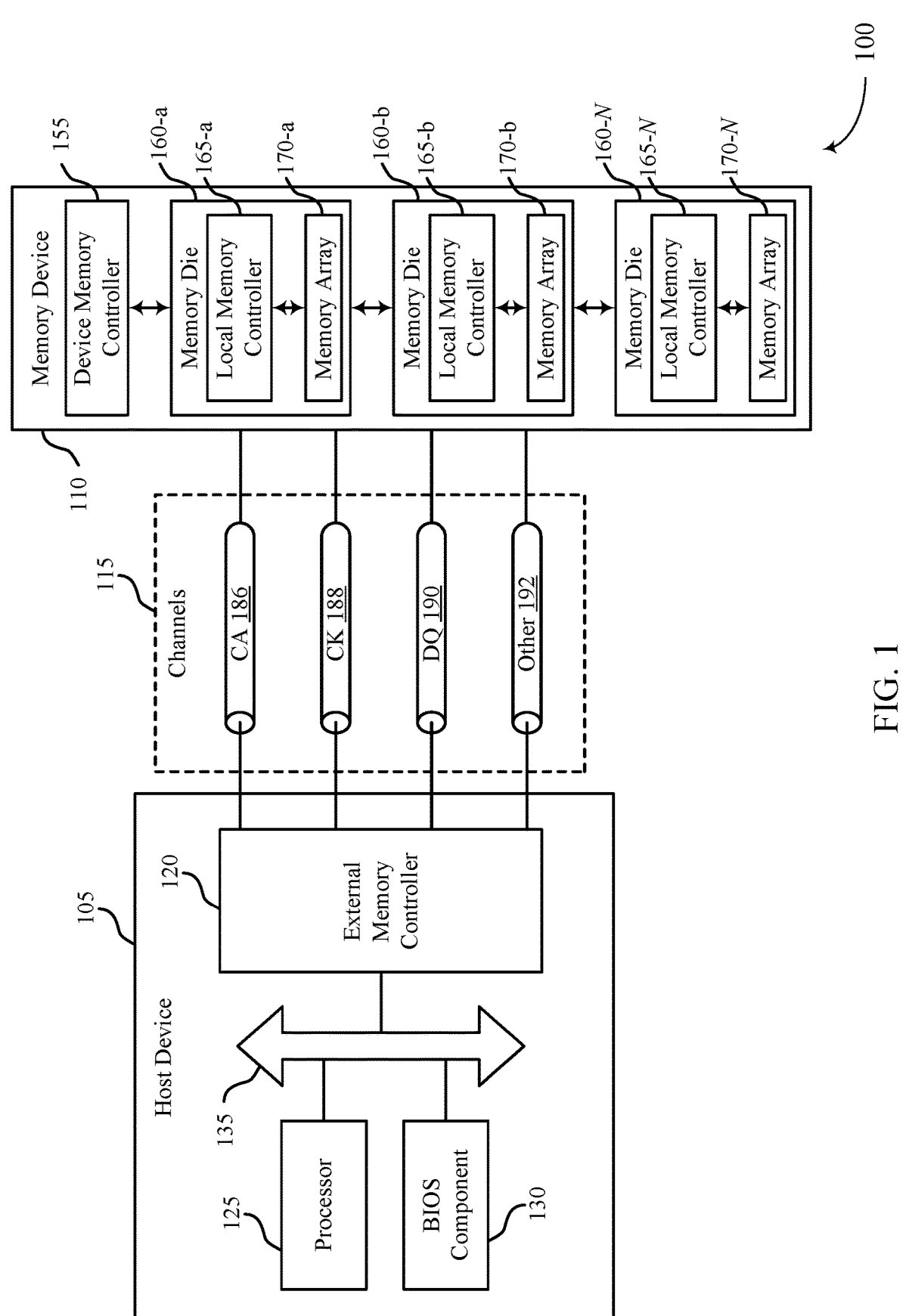
FIG. 1 illustrates an example of a system that supports cross point array architecture for multiple decks in accordance with examples as disclosed herein.

FIG. 1 illustrates an example of a system 100 that supports cross point array architecture for multiple decks in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, a memory device 110 may support a memory array 170 with more than four decks by adjusting the socket configuration of memory array 170. For example, memory array 170 may be divided into a grid of sub-blocks. Each sub-block may contain sockets for one or more access lines in multiple layers of the memory array (e.g., a sub-block may contain a single socket for a first bit line, or the sub-block may contain sockets for the first bit line and a second bit line). Additionally or alternatively, a sub-block may not contain any sockets. Sub-blocks may be arranged according to one or more periods. For example, sub-blocks containing sockets for a first access line may be arranged according to a first period, while sub-blocks containing sockets for a second access line may be arranged according to a second period.

Additionally or alternatively, a socket coupling an access line to an associated driver may intersect the access line in the middle of the access line or at an end of the access line. It should be noted that, although FIG. 1 describes using a chalcogenide material for storage, the techniques described herein may be applicable to any memory type that uses a self-selecting memory material or cross-point type architecture.

Figure 2:
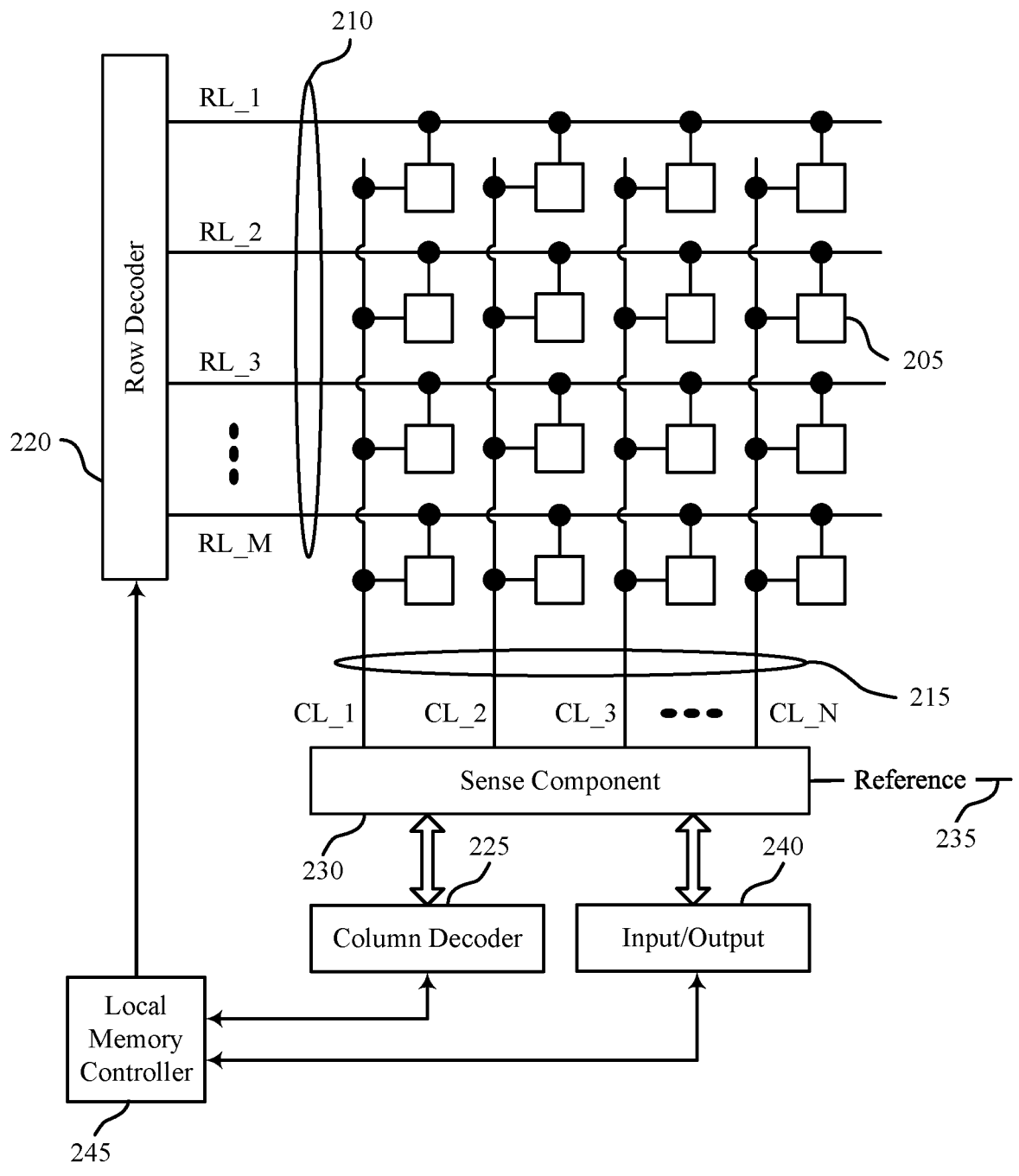
FIG. 2 illustrates an example of a memory die that supports cross point array architecture for multiple decks in accordance with examples as disclosed herein.

FIG. 2 illustrates an example of a memory die 200 that supports cross point array architecture for multiple decks in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 based on the received row address. A column decoder 225 may receive a column address from the local memory controller 245 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

In some cases, a memory die 200 may support more than four decks by adjusting the socket configuration of memory die 200. For example, memory die 200 may be divided into a grid of sub-blocks. Each sub-block may contain sockets for coupling decoders, such as row decoder 220, column decoder 220, or both to one or more access lines (e.g., row lines 210 or column lines 215) in multiple layers of the memory array (e.g., a sub-block may contain a single socket for a first bit, or the sub-block may contain sockets for the first bit line and a second bit line). Additionally or alternatively, a sub-block may not contain any sockets. Sub-blocks may be arranged according to one or more periods. For example, sub-blocks containing sockets for a first access line may be arranged according to a first period, while sub-blocks containing sockets for a second access line may be arranged according to a second period.

Additionally or alternatively, a socket coupling an access line to an associated driver may intersect the access line in the middle of the access line or at an end of the access line. It should be noted that, although FIG. 2 describes using a chalcogenide material for storage, the techniques described herein may be applicable to any memory type that uses a self-selecting memory material or cross-point type architecture.

Figure 3:
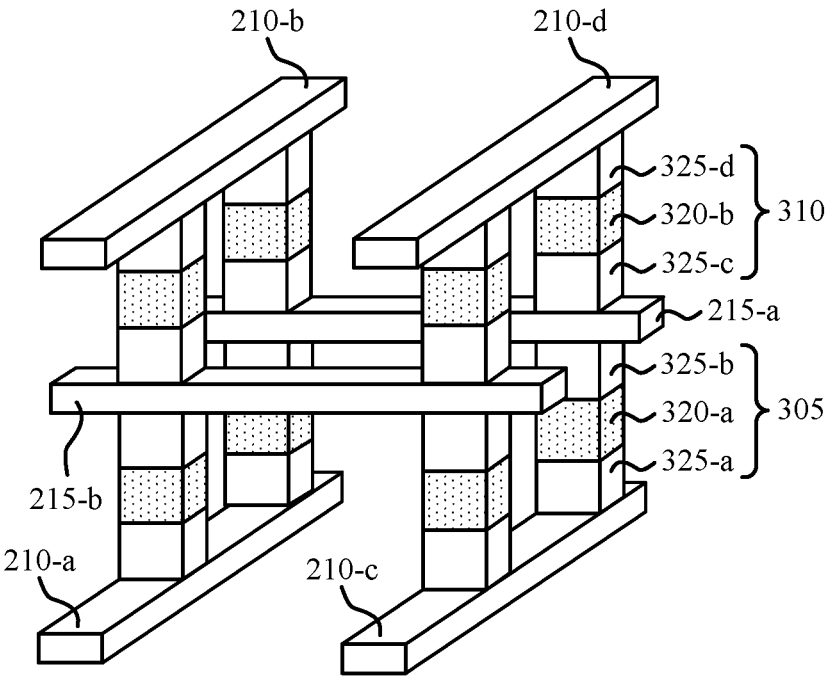
FIG. 3 illustrates an example of memory cells that support cross point array architecture for multiple decks in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate (not shown) and a second deck 310 of memory cells on top of the first array or deck 305. Though the example of memory array 300 includes two decks 305, 310, the memory array 300 may include any quantity of decks (e.g., one or more than two).

Memory array 300 may also include a row line 210-*a*, a row line 210-*b*, a row line 210-*c*, a row line 210-*d*, a column line 215-*a*, and a column line 215-*b*, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-*a*, a storage element 320-*a*, or an electrode 325-*b*. One or more memory cells of the second deck 310 may include an electrode 325-*c*, a storage element 320-*b*, and an electrode 325-*d*. The storage elements 320 may be examples of a chalcogenide material, such as a phase change storage element, a thresholding storage element, or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-*c* of the second deck 310 and the second electrode 325-*b* of the first deck 305 may be coupled with column line 215-*a* such that the column line 215-*a* may be shared by vertically adjacent memory cells.

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Sc), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 320 may be an example of a phase change memory cell. In such examples, the material used in the storage element 320 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., electrode 325-*a*, storage element 320-*a*, electrode 325-*b*), the various parameters of the programming pulse may influence (e.g., determine, set, program) a particular behavior or characteristic of the material of the storage element 320, such as the threshold voltage of the material or the resistance of the material. To program a low-resistance state (e.g., a relatively crystalline state) in the phase change memory cell, a programming pulse may be applied that heats or melts the material of the storage element 320, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state. To program a high-resistance state (e.g., a relatively amorphous state) in the phase change memory cell, a programming pulse may be applied that heats and/or melts the material of the storage element 320. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 320 depending on the logic state stored by the material of the storage element 320 may correspond to the read window of the storage element 320. In some cases, a portion of a storage element may undergo a material change associated with the logic states.

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 320 may be an example of a self-selecting memory cell. In such examples, the material used in the storage element 320 may be based on an alloy (such as the alloys listed above) and may be operated so as to undergo a change to different physical state during normal operation of the memory cell. For example, a self-selecting memory cell may have an high threshold voltage state and a low threshold voltage state. An high threshold voltage state may correspond to a first logic state (e.g., a RESET state) and a low threshold voltage state may correspond to a second logic state (e.g., a SET state).

During a programming (write) operation of a self-selecting memory cell (e.g., including electrode 325-*a*, storage element 320-*a*, and electrode 325-*b*), a polarity used for a write operation may influence (determine, set, program) a particular behavior or characteristic of the material of the storage element 320, such as the threshold voltage of the material. The difference in threshold voltages of the material of the storage element 320 depending on the logic state stored by the material of the storage element 320 (e.g., the difference between the threshold voltage when the material is storing a logic state '0' versus a logic state '1') may correspond to the read window of the storage element 320.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but need not be in a pillar or stack configuration).

In some cases, a memory array 300 may support more than four decks (e.g., in addition to the decks 305 and 310) by adjusting the socket configuration of memory array 300. For example, memory array 300 may be divided into a grid of sub-blocks. Each sub-block may contain sockets for coupling decoders, to one or more access lines (e.g., row lines 210 or column lines 215) in multiple layers of the memory array (e.g., a sub-block may contain a single socket for a first bit, or the sub-block may contain sockets for the first bit line and a second bit line). Additionally or alternatively, a sub-block may not contain any sockets. Sub-blocks may be arranged according to one or more periods. For example, sub-blocks containing sockets for a first access line may be arranged according to a first period, while sub-blocks containing sockets for a second access line may be arranged according to a second period.

Additionally or alternatively, a socket coupling an access line to an associated driver may intersect the access line in the middle of the access line or at an end of the access line. It should be noted that, although FIG. 3 describes using a chalcogenide material for the storage elements 320, the techniques described herein may be applicable to any memory type that uses a self-selecting memory material or cross-point type architecture.

Figure 4:
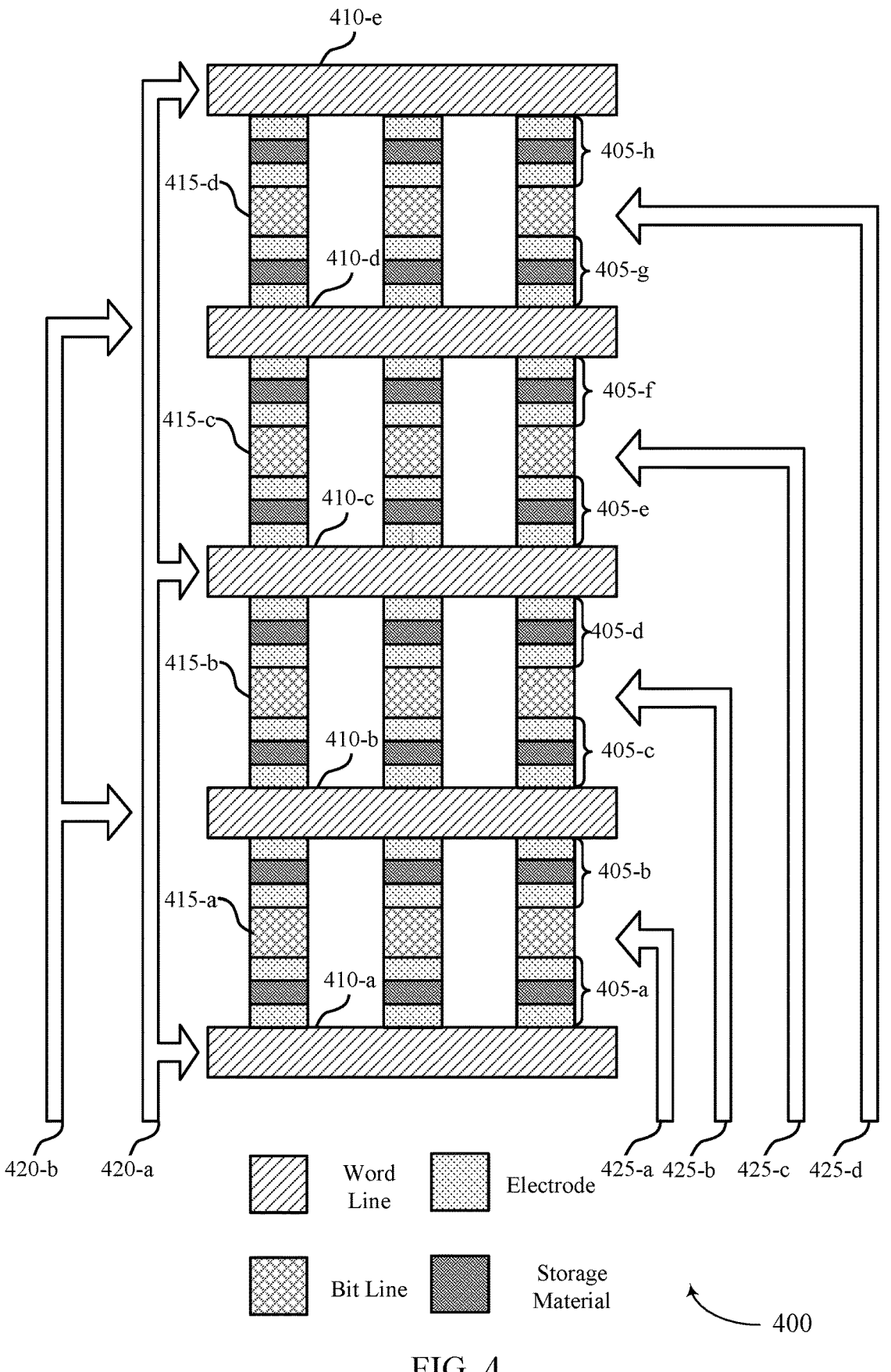
FIG. 4 illustrates an example of a set of decks that supports cross point array architecture for multiple decks in accordance with examples as disclosed herein.

FIG. 4 illustrates an example of a set of decks 400 that supports cross point array architecture for multiple decks in accordance with examples as disclosed herein. In some cases, the set of decks 400 may include up to six decks of memory cells. In such cases, the set of decks 400 may include decks of memory cells 405-*a* through 405-*f*. In other cases, the set of decks 400 may include up to eight decks of memory cells. In such cases, the set of decks 400 may additionally include decks 405-*g* and 405-*h* (e.g., in addition to decks 405-*a* through 405-*f*).

The set of decks 400 may include one or more access lines for accessing memory cells of the decks 405. A memory cell may include a storage material, such as a chalcogenide material, arranged between an upper electrode coupled to a first access line and a lower electrode coupled to a second access line. For example, a memory cell in the first deck 405-*a* may be accessed using a first word line 410-*a* and a first bit line 415-*a*, while a memory cell in the second deck 405-*b* may be accessed using the first bit line 415-*a* and a second word line 410-*b*. Similarly, a memory cell in the third deck 405-*c* may be accessed using the second word line 410-*b* and a second bit line 415-*b*, a memory cell in the fourth deck 405-*d* may be accessed using a third word line 410-*c* and the second bit line 415-*b*, and so on, such that a memory cell in any deck may be accessed using the word lines and bit lines directly above and below the deck, as illustrated in FIG. 4.

The access lines may be coupled to decoders (not shown) arranged beneath the set of decks 400 using one of the word line sockets 420 or one of the bit line sockets 425. For example, the word lines 410-*a*, 410-*c*, and 410-*e* (e.g., "even" word lines) may be coupled with a first word line decoder using word line socket 420-*a*, while word lines 410-*b* and 410-*d* (e.g., "odd" word lines) may be coupled with a second word line decoder using word line socket 420-*b*.

In some cases, each bit line may be coupled to a respective bit line decoder (e.g., instead of sharing a decoder, as with the word lines). For example, the first bit line 415-*a* may be coupled with a first decoder using bit line socket 425-*a*, the second bit line 415-*b* may be coupled with a second decoder using bit line socket 425-*b*, the third bit line 415-*c* may be coupled with a third decoder using bit line socket 425-*c*, and the fourth bit line 415-*d* may be coupled with a fourth decoder using bit line socket 425-*d*.

In some examples, each access line (e.g., each word line of word lines 410 and each bit line bit lines 415) may be divided into one or more segments. Each segment of an access line may be separate (e.g., physically separated) from segments of the same access line and may be coupled with a respective decoder for the access line. The socket for a segment may be located in the middle of the segment (e.g., located so that memory cells lie on either side of the socket) or at either end of a segment (e.g., located so that memory cells lie on one side of the socket, but not the other side). In some cases, the sockets coupling access line segments to decoders may run vertically through the set of decks 400, while the access lines may lie horizontally through the set of decks 400.

It should be noted that, although examples as disclosed herein describe a bit line and a word line, one skilled in the art should appreciate that both a bit line and a word line may be examples of an access line, and that the definitions of a word line and a bit line may be switched.

Figure 5:
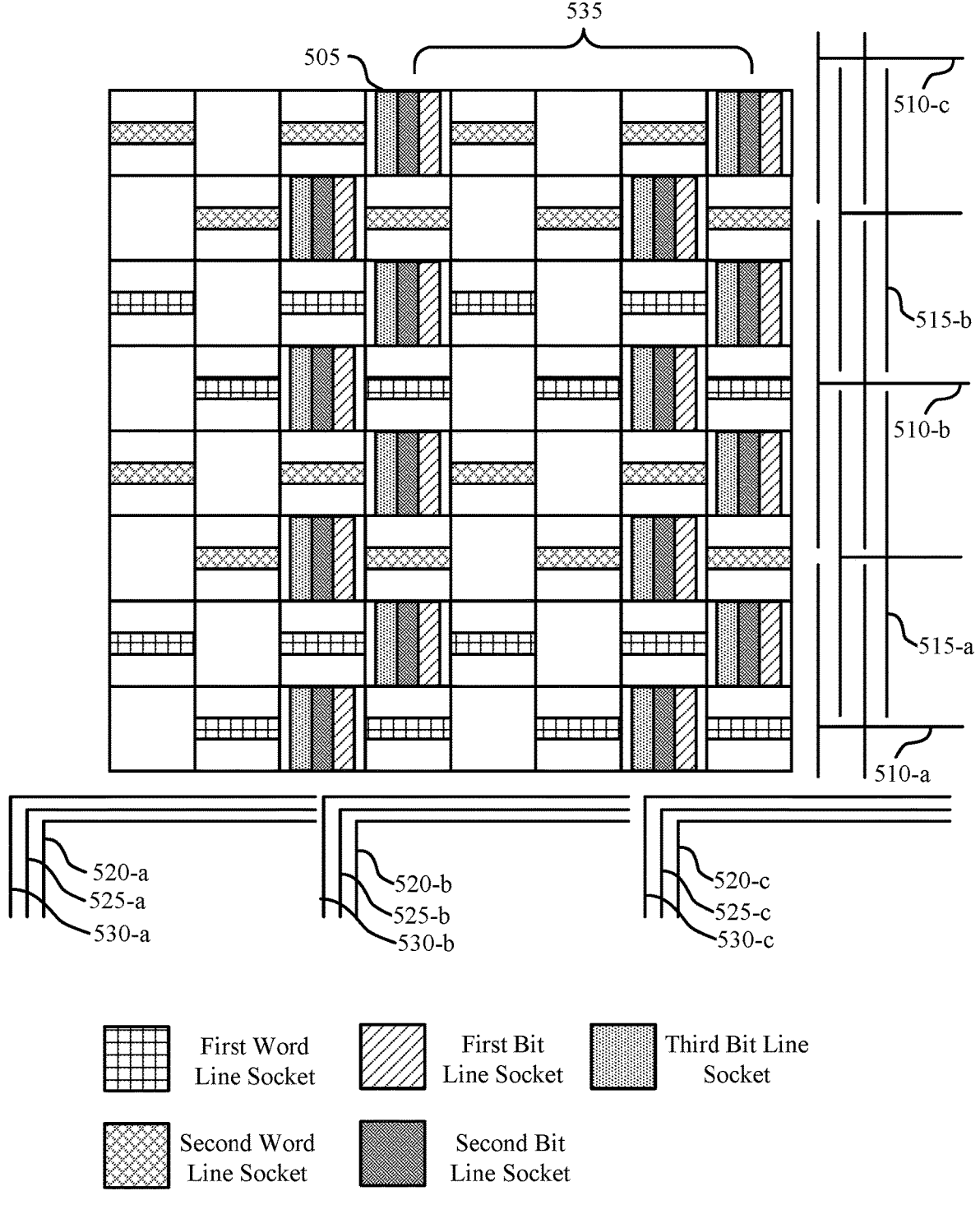
FIG. 5 illustrates an example of a top-down view of a memory array that supports cross point array architecture for multiple decks in accordance with examples as disclosed herein.

FIG. 5 illustrates an example of a top-down view of a memory array 500 that supports cross point array architecture for multiple decks in accordance with examples as disclosed herein. The memory array 500 may include the stack of decks 400 as described with reference to FIG. 4. That is, the memory array 500 may include a quantity of decks (e.g., six decks) in which access lines are divided into access line segments. Each segment of an access line may be coupled with a decoder for that access line located beneath the memory array 500 using a socket.

The memory array 500 may be divided into a quantity tiles, which may further be divided into a quantity of sub-blocks arranged in a grid structure overlaying the tile. A tile may refer to a set of a finite quantity of memory cells having a corresponding set of memory cell addresses in which each memory cell of the set may be individually addressed.

In some cases, a tile of the memory array 500 may not be a square (e.g., the tile may not correspond to an n-by-n arrangement of sub-blocks). Instead, a tile may be a more general arrangement of sub-blocks, which may be repeated to form the memory array 500. In some cases, a tile may terminate on the edge of the memory array. In such cases, the tile may include banks of drivers, such as bit line decoders or word line decoders, which have socket connections outside the footprint of the tile.

The sub-blocks of a tile may indicate locations in the tile where sockets couple access line segments (e.g., bit line and word line segments) with respective access line decoders, in some cases located beneath the memory array 500. By way of example, a sub-block 505 of a tile may contain one or more sockets for coupling a bit line segment with a respective bit line decoder. A socket of the sub-block 505 may run vertically through the memory array 500 (e.g., the socket may be an example of a via), while the access lines may run horizontally through the memory array (e.g., bit lines may run in a first horizontal direction, while word lines may run in a second horizontal direction orthogonal to the first horizontal direction).

By way of example, the memory array 500 may include a first word line divided into word line segments 510-*a* through 510-*c* and a second word line divided into word line segments 515-*a* and 515-*b*. A tile of the memory array 500 may include sub-blocks for coupling the word line segments 510 and 515 with respective word line decoders, the sub-blocks arranged as illustrated in FIG. 5. In some cases, the word line segments 510 may be coupled with a first set of decks (e.g., the first word line may be an "even" word line) and the word line segments 515 may be coupled with a second set of decks (e.g., the second word line may be an "odd" word line). In some cases, the sockets coupling word line segments 510 and 515 with respective word line decoders may be located in the middle (e.g., substantially in the center) of the word line segment.

In some cases, the memory array 500 may include a first bit line divided into bit line segments 520-*a* through 520-*c*, a second bit line divided into bit line segments 525-*a* through 525-*c*, and a third bit line divided into bit line segments 530-*a* through 530-*c*. A tile of the memory array 500 may include sub-blocks for coupling the bit line segments 520, 525, and 530 with respective word line decoders using the sub-blocks arranged as illustrated in FIG. 5. That is, sockets coupling the first bit line segments 520, the second bit line second bit line segments 525, and the third bit line segments 530 may be located in the sub-block 505. In some cases, the sub-blocks containing the first bit line segments 520, the second bit line second bit line segments 525, and the third bit line segments 530 may be arranged according to a periodicity 535 For example, a period separating sub-blocks containing a particular bit line segment may indicate a quantity of sub-blocks (e.g., in a horizontal direction) between repeating arrangements of sockets.

In some cases, the sockets coupling bit line segments 520, 525, and 530 with respective bit line decoders may be located at the end of the respective bit line segments. The word line segments 510 and 515 and the bit line segments 520, 525, and 530 may be schematically depicted at the right and bottom, respectively, of the memory array 500 in a cross sectional view of the memory array 500, with respective sockets running vertically (e.g., in the z-direction).

In some cases, the bit line segments 520, 525, and 530 may each be substantially the same length. While the length of sockets coupling the bit line segments with respective drivers may differ in length, this difference may be small compared to the relative length of the access line segments. In some cases, the size of a tile of the memory array 500 may depend on the length and configuration of the bit line segments 520, 525, and 530 and word line segments 510 and 515. For example, in the configuration illustrated in FIG. 5, a tile may include a 4 by 4 arrangement of sub-blocks (e.g., 16 total sub-blocks) that includes sockets for each of the bit lines and each of the word lines. However, it should be appreciated that other tile sizes, tile configurations (e.g., a more general arrangement that may be congruently repeated), or both are possible.

Figure 6:
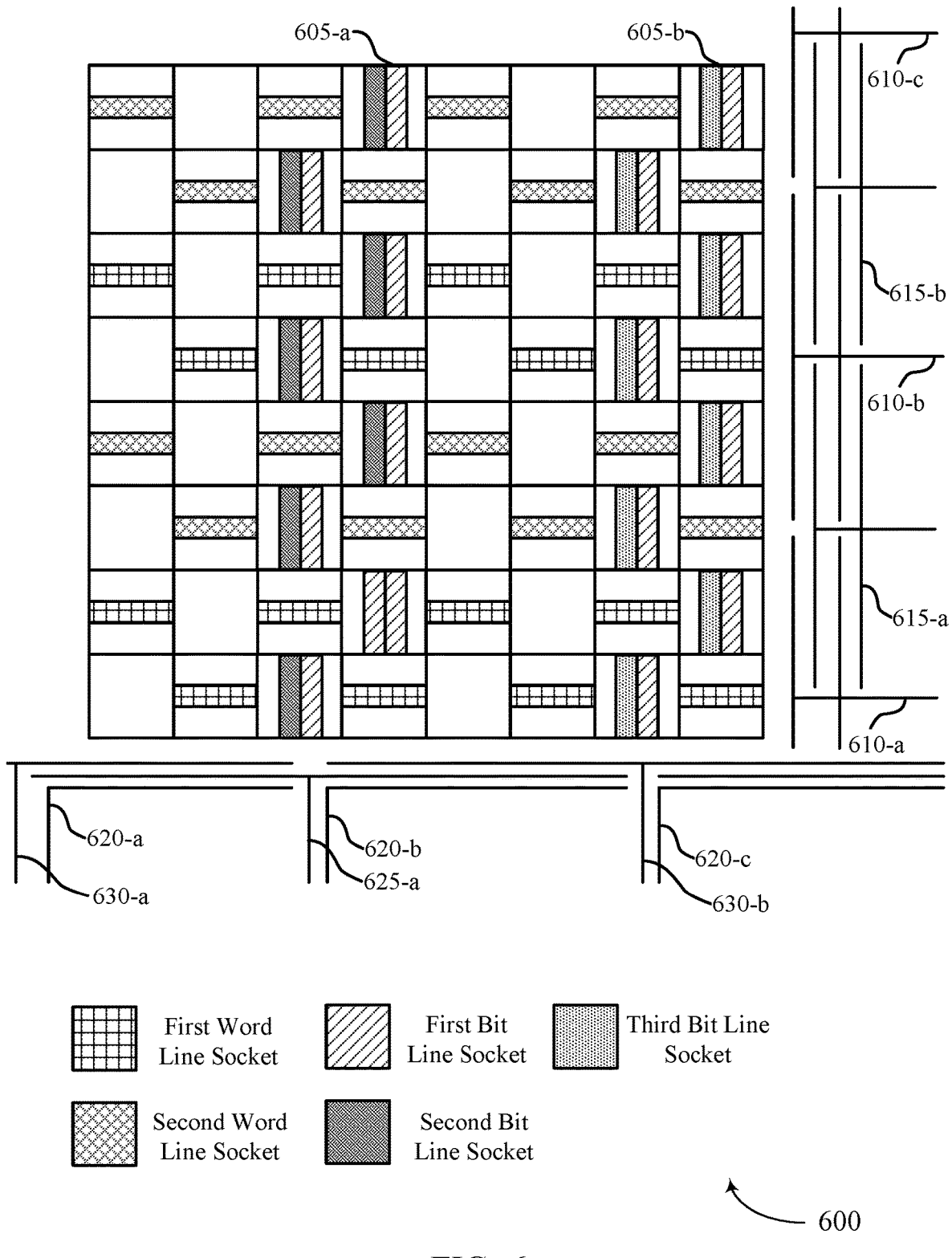
FIG. 6 illustrates an example of a top-down view of a memory array that supports cross point array architecture for multiple decks in accordance with examples as disclosed herein.

FIG. 6 illustrates an example of a top-down view of a memory array 600 that supports cross point array architecture for multiple decks in accordance with examples as disclosed herein. The memory array 600 may include the stack of decks 400 as described with reference to FIG. 4. That is, the memory array 600 may include a quantity of decks (e.g., six decks) in which access lines are divided into access line segments. Each segment of an access line may be coupled with a decoder for that access line located beneath the memory array 600 using a socket.

The memory array 600 may be divided into a quantity tiles, which may further be divided into a quantity of sub-blocks arranged in a grid structure overlaying the tile. A tile may refer to a set of a finite quantity of memory cells having a corresponding set of memory cell addresses in which each memory cell of the set may be individually addressed.

In some cases, a tile of the memory array 600 may not be a square (e.g., the tile may not correspond to an n-by-n arrangement of sub-blocks). Instead, a tile may be a more general arrangement of sub-blocks, which may be repeated to form the memory array 600. In some cases, a tile may terminate on the edge of the memory array. In such cases, the tile may include banks of drivers, such as bit line decoders or word line decoders, which have socket connections outside the footprint of the tile.

By way of example, the memory array 600 may include a first word line divided into word line segments 610-*a* through 610-*c* and a second word line divided into word line segments 615-*a* and 615-*b*. A tile of the memory array 600 may include sub-blocks for coupling the word line segments 610 and 615 with respective word line decoders, the sub-blocks arranged as illustrated in FIG. 6. In some cases, the word line segments 610 may be coupled with a first set of decks (e.g., the first word line may be an "even" word line) and the word line segments 615 may be coupled with a second set of decks (e.g., the second word line may be an "odd" word line). In some cases, the sockets coupling word line segments 610 and 615 with respective word line decoders may be located in the middle (e.g., substantially in the center) of the word line segment.

In some cases, the memory array 600 may include a first bit line divided into bit line segments 620-*a* through 620-*c*, a second bit line divided into bit line segments 625-*a* and 625-*b*, and a third bit line divided into bit line segments 630-*a* through 630-*b*. A tile of the memory array 600 may include sub-blocks for coupling the bit line segments 620,

625, and 630 with respective bit line decoders using the sub-blocks arranged as illustrated in FIG. 6. For example, the memory array 600 may include a first sub-block 605-*a* containing a configuration of sockets that includes sockets for the first bit line segments 620 and the second bit line segments 625 and a second sub-block 605-*b* containing a configuration of sockets that includes sockets for the first bit line segments 620 and the third bit line segments 630. Such a configuration of sockets and sub-blocks may decrease the complexity of sockets by allowing the socket regions to be less crowded, for example compared to the configuration illustrated in FIG. 5.

In some cases, the sub-blocks containing the first bit line segments 620 may be separated by a first period, while the sub-blocks containing the second bit line segments 625 or the third bit line segments 630 may be separated by a second period. For example, a period separating sub-blocks containing a particular bit line segment may indicate a quantity of sub-blocks (e.g., in a horizontal direction) between repeating arrangements of sockets. In some cases, the second period may be larger than the first period (e.g., the second period may be twice as large as the first period).

In some cases, the sockets coupling the first bit line segments 620 with respective bit line decoders may be located at the end of the respective bit line segments. Additionally or alternatively, the sockets coupling the second bit line segments 625 and the third bit line segments 630 may be located in the middle of the respective bit line segments. The word line segments 610 and 615 and the bit line segments 620, 625, and 630 may be schematically depicted at the right and bottom, respectively, of the memory array 600 in a cross sectional view of the memory array 600, with respective sockets running vertically (e.g., in the z-direction).

In some cases, the second bit line segments 625 and the third bit line segments 630 may each be substantially the same length (e.g., a first length), while the first bit line segments 620 may be shorter than the first length. Thus, a quantity of the decoders for the bit line segments may be equivalent to a set of decks which contain four decks. However, the corresponding tile size of the memory array 600 may be larger. For example, in the configuration illustrated in FIG. 6, a tile may include a 8 by 8 arrangement of sub-blocks (e.g., 64 total sub-blocks) that includes sockets for each of the bit lines and each of the word lines. However, it should be appreciated that other tile sizes, tile configurations (e.g., a more general arrangement that may be congruently repeated), or both are possible.

Figure 7:
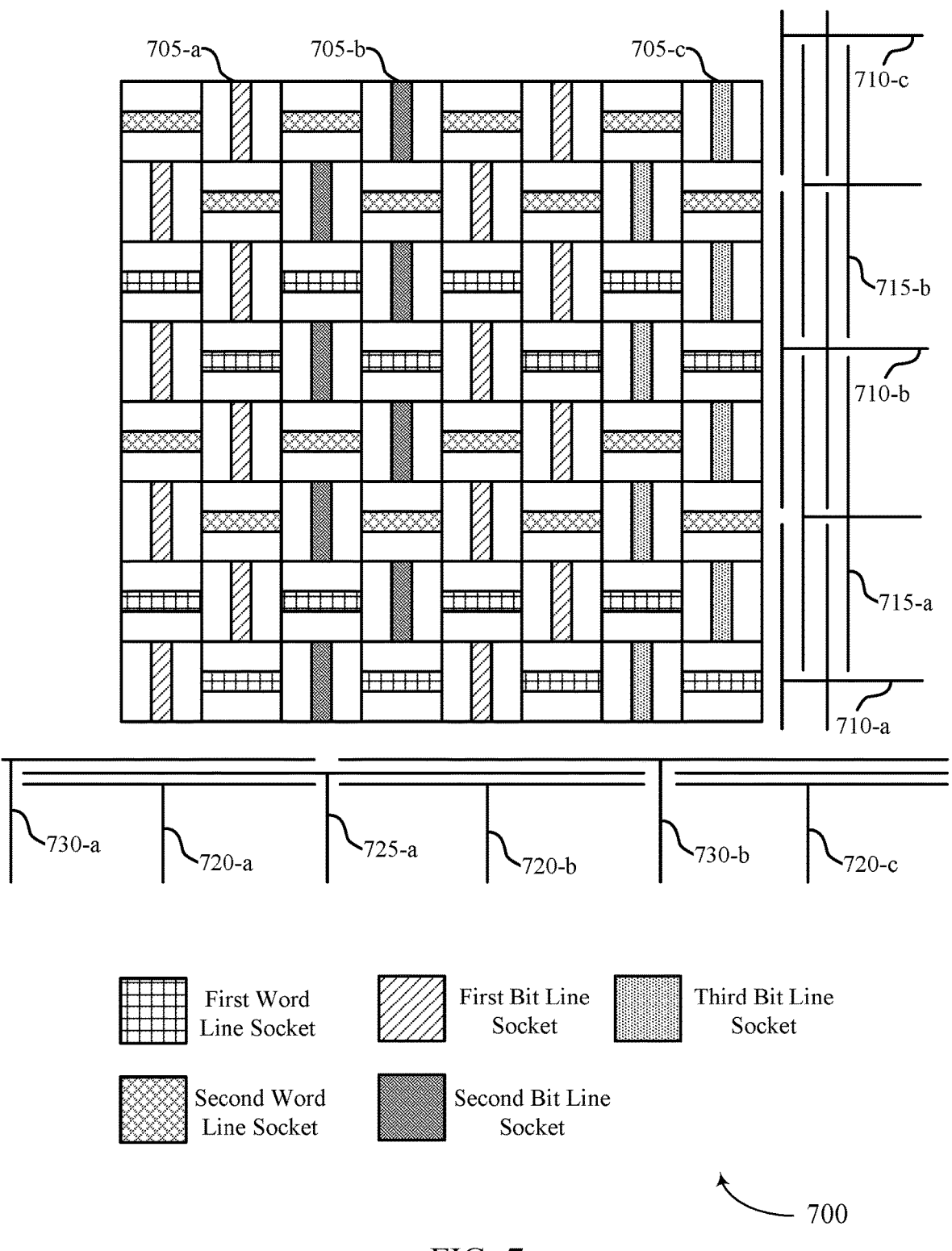
FIG. 7 illustrates an example of a top-down view of a memory array that supports cross point array architecture for multiple decks in accordance with examples as disclosed herein.

FIG. 7 illustrates an example of a top-down view of a memory array 700 that supports cross point array architecture for multiple decks in accordance with examples as disclosed herein. The memory array 700 may include the stack of decks 400 as described with reference to FIG. 4. That is, the memory array 700 may include a quantity of decks (e.g., six decks) in which access lines are divided into access line segments. Each segment of an access line may be coupled with a decoder for that access line located beneath the memory array 700 using a socket.

The memory array 700 may be divided into a quantity tiles, which may further be divided into a quantity of sub-blocks arranged in a grid structure overlaying the tile. A tile may refer to a set of a finite quantity of memory cells having a corresponding set of memory cell addresses in which each memory cell of the set may be individually addressed.

In some cases, a tile of the memory array 700 may not be a square (e.g., the tile may not correspond to an n-by-n arrangement of sub-blocks). Instead, a tile may be a more general arrangement of sub-blocks, which may be repeated to form the memory array 700. In some cases, a tile may terminate on the edge of the memory array. In such cases, the tile may include banks of drivers, such as bit line decoders or word line decoders, which have socket connections outside the footprint of the tile.

By way of example, the memory array 700 may include a first word line divided into word line segments 710-*a* through 710-*c* and a second word line divided into word line segments 715-*a* and 715-*b*. A tile of the memory array 700 may include sub-blocks for coupling the word line segments 710 and 715 with respective word line decoders, the sub-blocks arranged as illustrated in FIG. 7. In some cases, the word line segments 710 may be coupled with a first set of decks (e.g., the first word line may be an "even" word line) and the word line segments 715 may be coupled with a second set of decks (e.g., the second word line may be an "odd" word line). In some cases, the sockets coupling word line segments 710 and 715 with respective word line decoders may be located in the middle (e.g., substantially in the center) of the word line segment.

In some cases, the memory array 700 may include a first bit line divided into bit line segments 720-*a* through 720-*c*, a second bit line divided into bit line segments 725-*a* and 725-*b*, and a third bit line divided into bit line segments 730-*a* through 730-*b*. A tile of the memory array 700 may include sub-blocks for coupling the bit line segments 720, 725, and 730 with respective bit line decoders using the sub-blocks arranged as illustrated in FIG. 7. For example, the memory array 700 may include a first sub-block 705-*a* containing sockets for the first bit line segments 720, a second sub-block 705-*b* containing sockets for the second bit line segments 725, and a third sub-block 705-*c* containing sockets for the first bit line segments 720 and the third bit line segments 730.

In some cases, the sub-blocks containing the first bit line segments 720 may be separated by a periodicity first 735, while the sub-blocks containing the second bit line segments 725 or the third bit line segments 730 may be separated by a second periodicity. For example, a period separating sub-blocks containing a particular bit line segment may indicate a quantity of sub-blocks (e.g., in a horizontal direction) between repeating arrangements of sockets. The second periodicity may be larger than the first periodicity (e.g., the second periodicity may be twice as large as the first periodicity). In some cases the sockets coupling the first bit line segments 720, the second bit line segments 725, and the third bit line segments 730 may be located in the middle of the respective bit line segments.

In some cases, the second bit line segments 725 and the third bit line segments 730 may each be substantially the same length (e.g., a first length), while the first bit line segments 720 may be shorter than the first length. Thus, a quantity of the decoders for the bit line segments may be equivalent to a set of decks which contain four decks. However, the corresponding tile size of the memory array 700 may be larger. The word line segments 710 and 715 and the bit line segments 720, 725, and 730 may be schematically depicted at the right and bottom, respectively, of the memory array 700 in a cross sectional view of the memory array 700, with respective sockets running vertically (e.g., in the z-direction).

In some examples, the resistance of the second and third bit line segments 725 and 730 may be greater than the resistance of the first bit line segment 720 (e.g., due to the difference in lengths). In order to compensate for the increased resistance, the thickness of the second and third bit line segments 725 and 730 may be increased (e.g., to reduce the resistance). Additionally or alternatively, leakage due to the adjusted length and thickness of the second and third bit line segments 725 and 730 may be mitigated by adjusted the word line selection voltage, the bit line selection voltage, or both.

Figure 8:
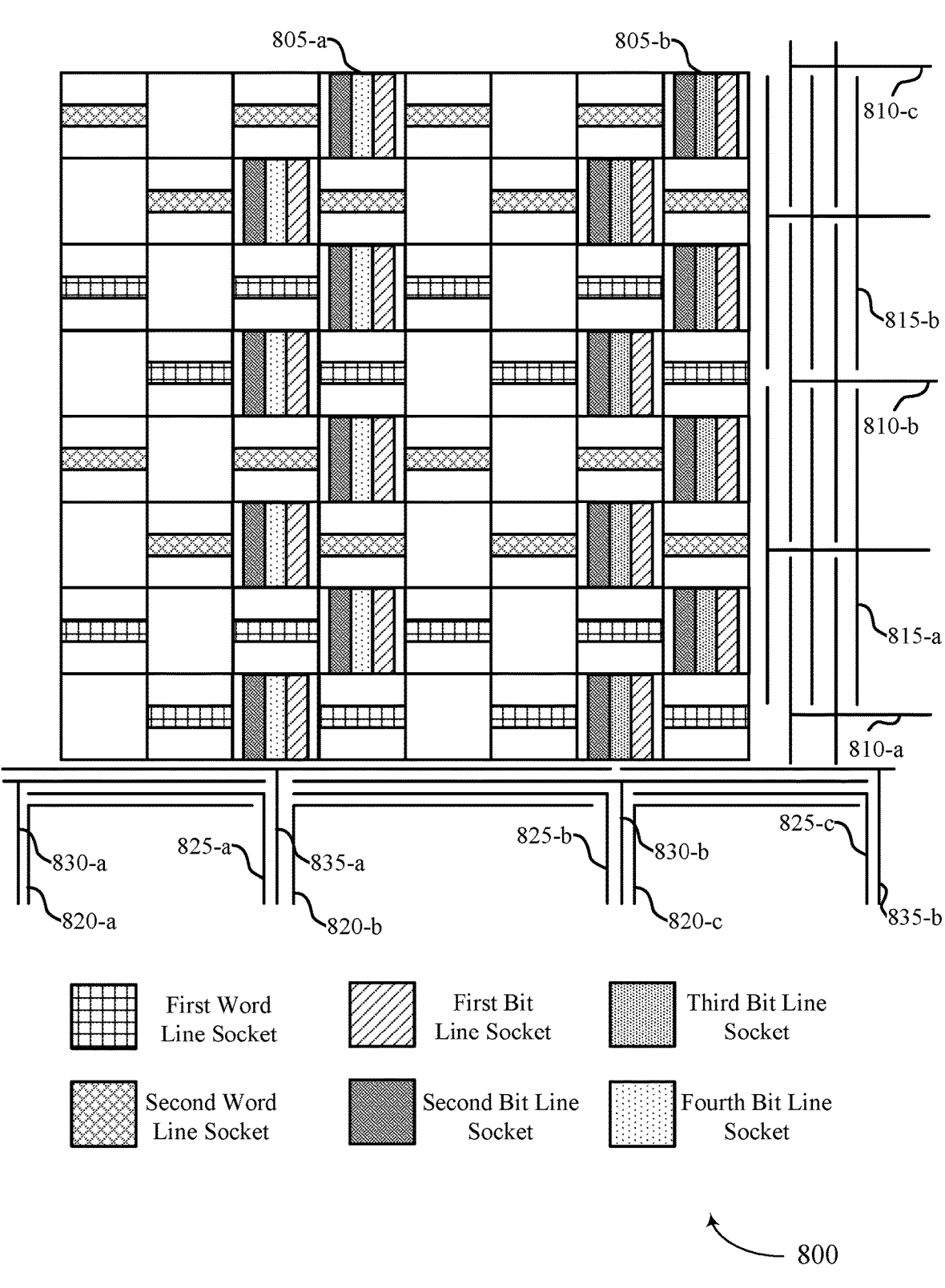
FIG. 8 illustrates an example of a top-down view of a memory array that supports cross point array architecture for multiple decks in accordance with examples as disclosed herein.

FIG. 8 illustrates an example of a top-down view of a memory array 800 that supports cross point array architecture for multiple decks in accordance with examples as disclosed herein. The memory array 800 may include the stack of decks 400 as described with reference to FIG. 4. That is, the memory array 800 may include a quantity of decks (e.g., eight decks) in which access lines are divided into access line segments. Each segment of an access line may be coupled with a decoder for that access line located beneath the memory array 800 using a socket.

The memory array 800 may be divided into a quantity tiles, which may further be divided into a quantity of sub-blocks arranged in a grid structure overlaying the tile. A tile may refer to a set of a finite quantity of memory cells having a corresponding set of memory cell addresses in which each memory cell of the set may be individually addressed.

In some cases, a tile of the memory array 800 may not be a square (e.g., the tile may not correspond to an n-by-n arrangement of sub-blocks). Instead, a tile may be a more general arrangement of sub-blocks, which may be repeated to form the memory array 800. In some cases, a tile may terminate on the edge of the memory array. In such cases, the tile may include banks of drivers, such as bit line decoders or word line decoders, which have socket connections outside the footprint of the tile.

By way of example, the memory array 800 may include a first word line divided into word line segments 810-a through 810-c and a second word line divided into word line segments 815-a and 815-b. A tile of the memory array 800 may include sub-blocks for coupling the word line segments 810 and 815 with respective word line decoders, the sub-blocks arranged as illustrated in FIG. 8. In some cases, the word line segments 810 may be coupled with a first set of decks (e.g., the first word line may be an "even" word line) and the word line segments 815 may be coupled with a second set of decks (e.g., the second word line may be an "odd" word line). In some cases, the sockets coupling word line segments 810 and 815 with respective word line decoders may be located in the middle (e.g., substantially in the center) of the word line segment.

In some cases, the memory array 800 may include a first bit line divided into bit line segments 820-a through 820-c, a second bit line divided into bit line segments 825-a through 825-c, a third bit line divided into bit line segments 830-a and 830-b, and a fourth bit line divided into bit line segments 835-a and 835-b. A tile of the memory array 800 may include sub-blocks for coupling the bit line segments 820, 825, 830, and 835 with respective bit line decoders using the sub-blocks arranged as illustrated in FIG. 8. For example, the memory array 800 may include a first sub-block 805-a containing a configuration of sockets that includes sockets for the first bit line segments 820, the second bit line segments 825, and the fourth bit line segments 835. The memory array 800 may also include a second sub-block 805-b containing a configuration of sockets that includes sockets for the first bit line segments 820, the second bit line segments 825, and the third bit line segments 830.

In some cases, the sub-blocks containing the first bit line segments 820 and the second bit line segments 825 may be separated by a first period, while the sub-blocks containing the third bit line segments 830 or the fourth bit line segments 835 may be separated by a second period. For example, a period separating sub-blocks containing a particular bit line segment may indicate a quantity of sub-blocks (e.g., in a horizontal direction) between repeating arrangements of sockets. The second periodicity may be larger than the first periodicity (e.g., the second periodicity may be twice as large as the first periodicity). In some cases the sockets coupling the third bit line segments 830 and the fourth bit line segments 835 may be located in the middle of the respective bit line segments, while the sockets coupling the first bit line segments 820 and the second bit line segments 825 may be located at the end of the respective bit line segments In some cases, the third bit line segments 830 and the fourth bit line segments 835 may each be substantially the same length (e.g., a first length), while the first bit line segments 820 and the second bit line segments 825 may be shorter than the first length. In some cases, the size of a tile of the memory array 800 may depend on the length and configuration of the bit line segments 820, 825, 830, and 835 and word line segments 810 and 815. For example, in the configuration illustrated in FIG. 8, a tile may include a 8 by 8 arrangement of sub-blocks (e.g., 64 total sub-blocks) that includes sockets for each of the bit lines and each of the word lines. However, it should be appreciated that other tile sizes, tile configurations (e.g., a more general arrangement that may be congruently repeated), or both are possible. The word line segments 810 and 815 and the bit line segments 820, 825, 830 and 835 may be schematically depicted at the right and bottom, respectively, of the memory array 800 in a cross sectional view of the memory array 800, with respective sockets running vertically (e.g., in the z-direction).

Figure 9:
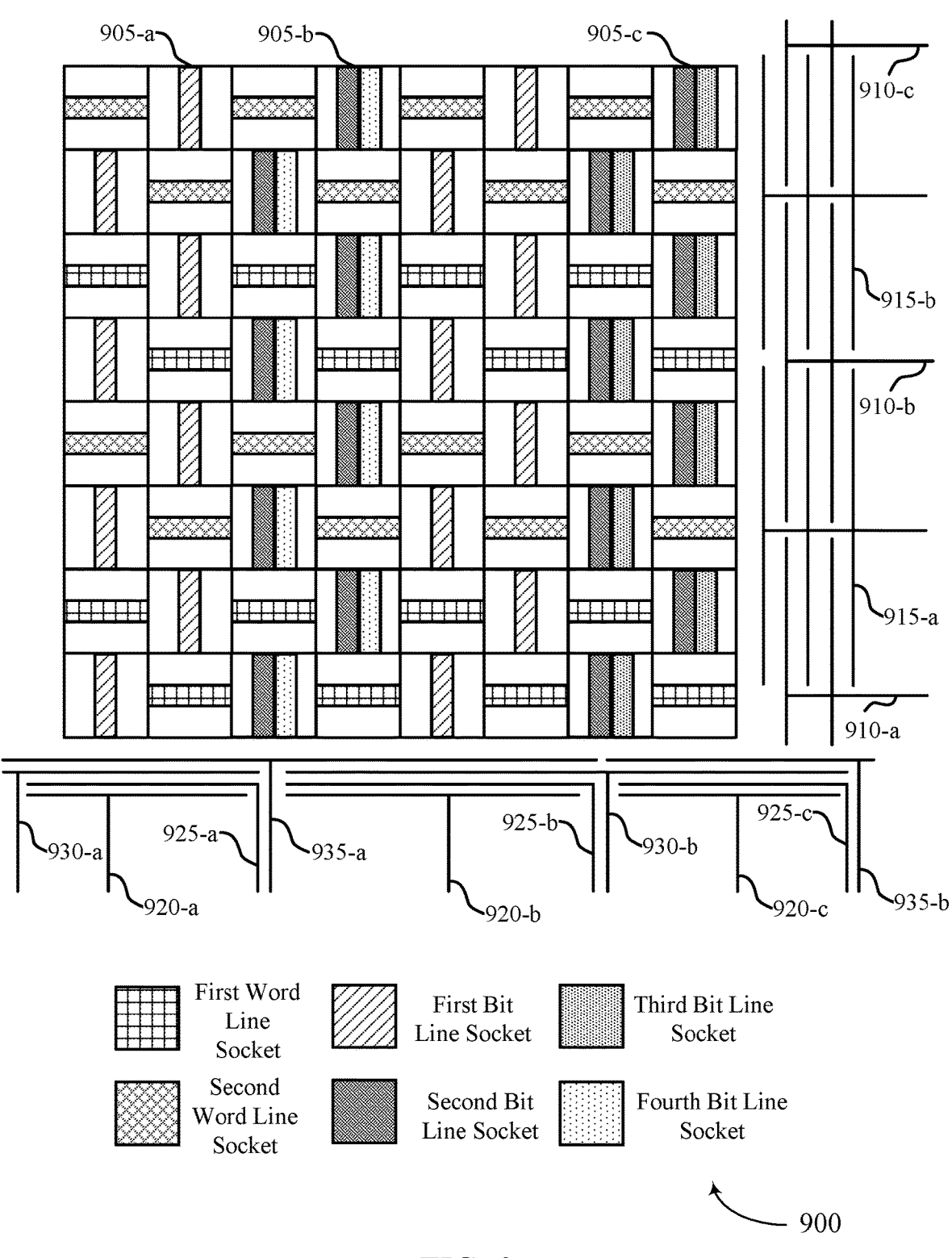
FIG. 9 illustrates an example of a top-down view of a memory array that supports cross point array architecture for multiple decks in accordance with examples as disclosed herein.

FIG. 9 illustrates an example of a top-down view of a memory array 900 that supports cross point array architecture for multiple decks in accordance with examples as disclosed herein. The memory array 900 may include the stack of decks 400 as described with reference to FIG. 4. That is, the memory array 900 may include a quantity of decks (e.g., eight decks) in which access lines are divided into access line segments. Each segment of an access line may be coupled with a decoder for that access line located beneath the memory array 900 using a socket.

The memory array 900 may be divided into a quantity tiles, which may further be divided into a quantity of sub-blocks arranged in a grid structure overlaying the tile. A tile may refer to a set of a finite quantity of memory cells having a corresponding set of memory cell addresses in which each memory cell of the set may be individually addressed.

In some cases, a tile of the memory array 900 may not be a square (e.g., the tile may not correspond to an n-by-n arrangement of sub-blocks). Instead, a tile may be a more general arrangement of sub-blocks, which may be repeated to form the memory array 900. In some cases, a tile may terminate on the edge of the memory array. In such cases, the tile may include banks of drivers, such as bit line decoders or word line decoders, which have socket connections outside the footprint of the tile.

By way of example, the memory array 900 may include a first word line divided into word line segments 910-a through 910-c and a second word line divided into word line segments 915-a and 915-b. A tile of the memory array 900 may include sub-blocks for coupling the word line segments 910 and 915 with respective word line decoders, the sub-blocks arranged as illustrated in FIG. 9. In some cases, the word line segments 910 may be coupled with a first set of decks (e.g., the first word line may be an "even" word line) and the word line segments 915 may be coupled with a second set of decks (e.g., the second word line may be an "odd" word line). In some cases, the sockets coupling word line segments 910 and 915 with respective word line decoders may be located in the middle (e.g., substantially in the center) of the word line segment.

In some cases, the memory array 900 may include a first bit line divided into bit line segments 920-*a* through 920-*c*, a second bit line divided into bit line segments 925-*a* through 925-*c*, a third bit line divided into bit line segments 930-*a* and 930-*b*, and a fourth bit line divided into bit line segments 935-*a* and 935-*b*. A tile of the memory array 900 may include sub-blocks for coupling the bit line segments 920, 925, 930, and 935 with respective bit line decoders using the sub-blocks arranged as illustrated in FIG. 9. For example, the memory array 900 may include a first sub-block 905-*a* containing sockets for the first bit line segments 920. The memory array 900 may also include a second sub-block 905-*b* containing a configuration of sockets that includes sockets for the second bit line segments 925, and the fourth bit line segments 935. The memory array 900 may also include a third sub-block 905-*c* containing a configuration of sockets that includes sockets for the second bit line segments 925, and the third bit line segments 930.

In some cases, the sub-blocks containing the first bit line segments 920 and the second bit line segments 925 may be separated by a first period, while the sub-blocks containing the third bit line segments 930 or the fourth bit line segments 935 may be separated by a second period. For example, a period separating sub-blocks containing a particular bit line segment may indicate a quantity of sub-blocks (e.g., in a horizontal direction) between repeating arrangements of sockets. The second periodicity may be larger than the first periodicity (e.g., the second periodicity may be twice as large as the first periodicity). In some cases the sockets coupling the third bit line segments 930 and the fourth bit line segments 935 may be located in the middle of the respective bit line segments, while the sockets coupling the first bit line segments 920 and the second bit line segments 925 may be located at the end of the respective bit line segments In some cases, the second bit line segments 925, the third bit line segments 930, and the fourth bit line segments 935 may each be substantially the same length (e.g., a first length), while the first bit line segments 920 may be shorter than the first length. In some cases, the size of a tile of the memory array 900 may depend on the length and configuration of the bit line segments 920, 925, 930, and 935 and word line segments 910 and 915. For example, in the configuration illustrated in FIG. 9, a tile may include a 8 by 8 arrangement of sub-blocks (e.g., 64 total sub-blocks) that includes sockets for each of the bit lines and each of the word lines. However, it should be appreciated that other tile sizes, tile configurations, or both are possible. The word line segments 910 and 915 and the bit line segments 920, 925, 930 and 935 may be schematically depicted at the right and bottom, respectively, of the memory array 900 in a cross sectional view of the memory array 900, with respective sockets running vertically (e.g., in the z-direction).

Figure 10:
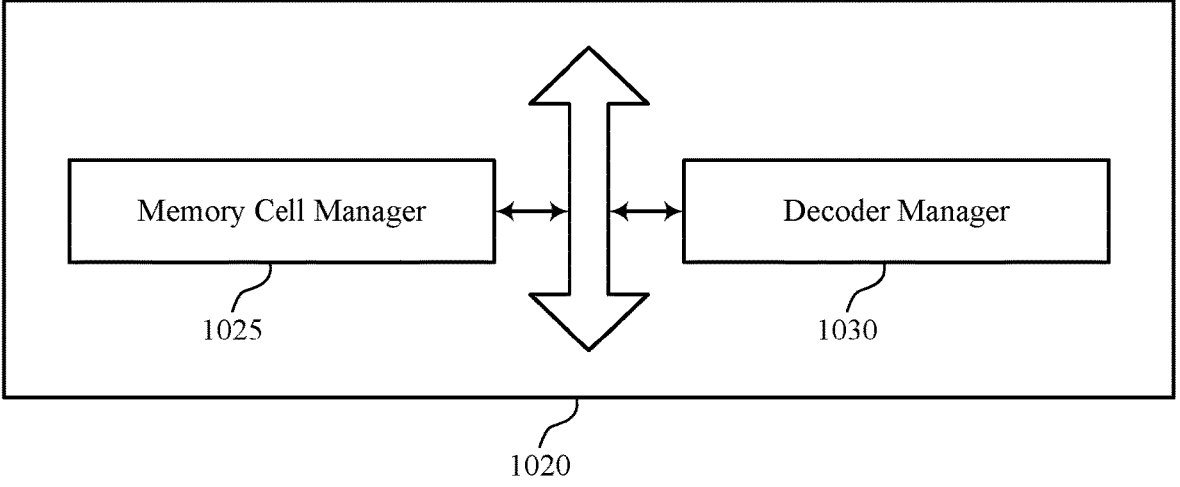
FIG. 10 shows a block diagram of a periodic access operation manager that supports cross point array architecture for multiple decks in accordance with examples as disclosed herein.

FIG. 10 shows a block diagram 1000 of a periodic access operation manager 1020 that supports cross point array architecture for multiple decks in accordance with examples as disclosed herein. The periodic access operation manager 1020 may be an example of aspects of a periodic access operation manager as described with reference to FIGS. 1 through 9. The periodic access operation manager 1020, or various components thereof, may be an example of means for performing various aspects of cross point array architecture for multiple decks as described herein. For example, the periodic access operation manager 1020 may include a memory cell manager 1025 a decoder manager 1030, or any combination thereof. Each of these components may communicate, directly or indirectly, with one another (e.g., via one or more buses).

The memory cell manager 1025 may be configured as or otherwise support a means for identifying at least one cell of a memory array, the memory array having a plurality of decks, a plurality of word lines, a plurality of word line decoders, a plurality of bit lines, and a plurality of bit line decoders positioned beneath the memory array, each of the plurality of bit lines coupled with a respective one or more decks of the plurality of decks, the plurality of bit lines including a first bit line, a second bit line, and a third bit line. The decoder manager 1030 may be configured as or otherwise support a means for accessing the at least one cell of the memory array using one of the plurality of word line decoders and one of the plurality of bit line decoders, where the each of the plurality of bit lines are coupled with a respective bit line decoder using a plurality of bit line sockets, where the plurality of bit line sockets includes a first subset of bit line sockets that are arranged according to a first periodicity and couple respective segments of the first bit line with respective bit line decoders of the plurality of bit line decoders, a second subset of bit line sockets that are arranged according to a second periodicity and couple respective segments of the second bit line with respective bit line decoders of the plurality of bit line decoders, and a third subset of bit line sockets that are arranged according to the second periodicity and couple respective segments of the third bit line with respective bit line decoders of the plurality of bit line decoders.

In some examples, the second periodicity is greater than the first periodicity.

In some examples, each bit line socket of the second subset of bit line sockets intersects each segment of the second bit line between ends of the segment and each bit line socket of the third subset of bit line sockets intersects each segment of the third bit line between ends of the segment.

In some examples, each bit line socket of the first subset of bit line sockets divides each segment of the first bit line into a first sub-segment and a second sub-segment.

Figure 11:
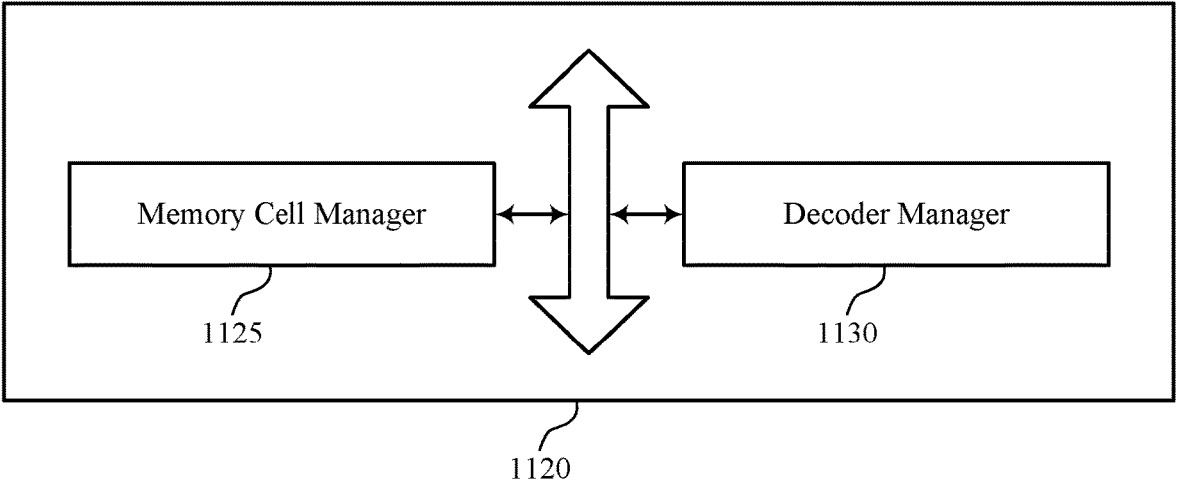
FIG. 11 shows a block diagram of a configuration access operation manager that supports cross point array architecture for multiple decks in accordance with examples as disclosed herein.
Figure 11:

FIG. 11 shows a block diagram 1100 of a configuration access operation manager 1120 that supports cross point array architecture for multiple decks in accordance with examples as disclosed herein. The configuration access operation manager 1120 may be an example of aspects of a configuration access operation manager as described with reference to FIGS. 1 through 9. The configuration access operation manager 1120, or various components thereof, may be an example of means for performing various aspects of cross point array architecture for multiple decks as described herein. For example, the configuration access operation manager 1120 may include a memory cell manager 1125 a decoder manager 1130, or any combination thereof. Each of these components may communicate, directly or indirectly, with one another (e.g., via one or more buses).

The memory cell manager 1125 may be configured as or otherwise support a means for identifying at least one cell of a memory array, the memory array including a plurality of tiles each tile of the plurality of tiles including a plurality of sub-blocks and a plurality of decks, where each sub-block of the plurality of sub-blocks includes a plurality of memory cells of the memory array addressable via a plurality of word lines and a plurality of bit lines, the plurality of bit lines including a first bit line coupled with a first deck and a second deck of the plurality of decks, a second bit line coupled with a third deck and a fourth deck of the plurality of decks, and a third bit line coupled with a fifth deck and a sixth deck of the plurality of decks. The decoder manager 1130 may be configured as or otherwise support a means for accessing the at least one cell of the memory array using a plurality of bit line decoders positioned beneath the memory array where a first bit line decoder of the plurality of bit line decoders is coupled with the first bit line using a first configuration of sockets within a first subset of the plurality of sub-blocks, a second bit line decoder of the plurality of bit line decoders is coupled with the second bit line using a second configuration of sockets within a second subset of the plurality of sub-blocks, and a third bit line decoder of the plurality of bit line decoders is coupled with the third bit line using a third configuration of sockets within a third subset of the plurality of sub-blocks.

In some examples, at least one sub-block of the plurality of sub-blocks includes sockets that couple more than one bit line with a respective bit line decoder of the plurality of bit line decoders.

In some examples, the plurality of bit lines further includes a fourth bit line, the fourth bit line coupled with a seventh deck and an eight deck of the plurality of decks. In some examples, a fourth bit line decoder of the plurality of bit line decoders is coupled with the fourth bit line using a fourth configuration of sockets.

In some examples, a first sub-block of the plurality of sub-blocks includes the first configuration of sockets, the second configuration of sockets, and the fourth configuration of sockets, and a second sub-block of the plurality of sub-blocks includes the first configuration of sockets, the second configuration of sockets, and the third configuration of sockets.

In some examples, a first pair of sub-blocks including the first configuration of sockets is separated by a first sub-block including the second configuration of sockets and the fourth configuration of sockets, and a second pair of pair of sub-blocks including the first configuration of sockets is separated by a second sub-block including the second configuration of sockets and the third configuration of sockets.

In some examples, a first sub-block of the plurality of sub-blocks includes the first configuration of sockets and the second configuration of sockets, and a second sub-block of the plurality of sub-blocks includes the first configuration of sockets and the third configuration of sockets.

FIG. 12 shows a flowchart illustrating a method 1200 that supports cross point array architecture for multiple decks in accordance with examples as disclosed herein. The operations of method 1200 may be implemented by a periodic access operation manager or its components as described herein. For example, the operations of method 1200 may be performed by a periodic access operation manager as described with reference to FIGS. 1 through 10. In some examples, a periodic access operation manager may execute a set of instructions to control the functional elements of the device to perform the described functions. Additionally or alternatively, the periodic access operation manager may perform aspects of the described functions using special-purpose hardware.

At 1205, the method may include identifying at least one cell of a memory array, the memory array having a plurality of decks, a plurality of word lines, a plurality of word line decoders, a plurality of bit lines, and a plurality of bit line decoders positioned beneath the memory array, each of the plurality of bit lines coupled with a respective one or more decks of the plurality of decks, the plurality of bit lines including a first bit line, a second bit line, and a third bit line. The operations of 1205 may be performed in accordance with examples as disclosed herein. In some examples, aspects of the operations of 1205 may be performed by a memory cell manager 1025 as described with reference to FIG. 10.

At 1210, the method may include accessing the at least one cell of the memory array using one of the plurality of word line decoders and one of the plurality of bit line decoders, where the each of the plurality of bit lines are coupled with a respective bit line decoder using a plurality of bit line sockets, where the plurality of bit line sockets includes a first subset of bit line sockets that are arranged according to a first periodicity and couple respective segments of the first bit line with respective bit line decoders of the plurality of bit line decoders, a second subset of bit line sockets that are arranged according to a second periodicity and couple respective segments of the second bit line with respective bit line decoders of the plurality of bit line decoders, and a third subset of bit line sockets that are arranged according to the second periodicity and couple respective segments of the third bit line with respective bit line decoders of the plurality of bit line decoders. The operations of 1210 may be performed in accordance with examples as disclosed herein. In some examples, aspects of the operations of 1210 may be performed by a decoder manager 1030 as described with reference to FIG. 10.

In some examples, an apparatus as described herein may perform a method or methods, such as the method 1200. The apparatus may include, features, circuitry, logic, means, or instructions (e.g., a non-transitory computer-readable medium storing instructions executable by a processor), or any combination thereof for performing the following aspects of the present disclosure:

Aspect 1: The apparatus, including features, circuitry, logic, means, or instructions, or any combination thereof for identifying at least one cell of a memory array, the memory array having a plurality of decks, a plurality of word lines, a plurality of word line decoders, a plurality of bit lines, and a plurality of bit line decoders positioned beneath the memory array, each of the plurality of bit lines coupled with a respective one or more decks of the plurality of decks, the plurality of bit lines including a first bit line, a second bit line, and a third bit line and accessing the at least one cell of the memory array using one of the plurality of word line decoders and one of the plurality of bit line decoders, where the each of the plurality of bit lines are coupled with a respective bit line decoder using a plurality of bit line sockets, where the plurality of bit line sockets includes a first subset of bit line sockets that are arranged according to a first periodicity and couple respective segments of the first bit line with respective bit line decoders of the plurality of bit line decoders, a second subset of bit line sockets that are arranged according to a second periodicity and couple respective segments of the second bit line with respective bit line decoders of the plurality of bit line decoders, and a third subset of bit line sockets that are arranged according to the second periodicity and couple respective segments of the third bit line with respective bit line decoders of the plurality of bit line decoders.

Aspect 2: The apparatus of aspect 1, further including operations, features, circuitry, logic, means, or instructions, or any combination thereof for the second periodicity is greater than the first periodicity.

Aspect 3: The apparatus of aspect 2, further including operations, features, circuitry, logic, means, or instructions, or any combination thereof for each bit line socket of the second subset of bit line sockets intersects each segment of the second bit line between ends of the segment and each bit line socket of the third subset of bit line sockets intersects each segment of the third bit line between ends of the segment.

Aspect 4: The apparatus of aspect 3, further including operations, features, circuitry, logic, means, or instructions, or any combination thereof for each bit line socket of the first subset of bit line sockets divides each segment of the first bit line into a first sub-segment and a second sub-segment.

FIG. 13 shows a flowchart illustrating a method 1300 that supports cross point array architecture for multiple decks in accordance with examples as disclosed herein. The operations of method 1300 may be implemented by a configuration access operation manager or its components as described herein. For example, the operations of method 1300 may be performed by a configuration access operation manager as described with reference to FIGS. 1 through 9 and 11. In some examples, a configuration access operation manager may execute a set of instructions to control the functional elements of the device to perform the described functions. Additionally or alternatively, the configuration access operation manager may perform aspects of the described functions using special-purpose hardware.

At 1305, the method may include identifying at least one cell of a memory array, the memory array including a plurality of tiles each tile of the plurality of tiles including a plurality of sub-blocks and a plurality of decks, where each sub-block of the plurality of sub-blocks includes a plurality of memory cells of the memory array addressable via a plurality of word lines and a plurality of bit lines, the plurality of bit lines including a first bit line coupled with a first deck and a second deck of the plurality of decks, a second bit line coupled with a third deck and a fourth deck of the plurality of decks, and a third bit line coupled with a fifth deck and a sixth deck of the plurality of decks. The operations of 1305 may be performed in accordance with examples as disclosed herein. In some examples, aspects of the operations of 1305 may be performed by a memory cell manager 1125 as described with reference to FIG. 11.

At 1310, the method may include accessing the at least one cell of the memory array using a plurality of bit line decoders positioned beneath the memory array where a first bit line decoder of the plurality of bit line decoders is coupled with the first bit line using a first configuration of sockets within a first subset of the plurality of sub-blocks, a second bit line decoder of the plurality of bit line decoders is coupled with the second bit line using a second configuration of sockets within a second subset of the plurality of sub-blocks, and a third bit line decoder of the plurality of bit line decoders is coupled with the third bit line using a third configuration of sockets within a third subset of the plurality of sub-blocks. The operations of 1310 may be performed in accordance with examples as disclosed herein. In some examples, aspects of the operations of 1310 may be performed by a decoder manager 1130 as described with reference to FIG. 11.

In some examples, an apparatus as described herein may perform a method or methods, such as the method 1300. The apparatus may include, features, circuitry, logic, means, or instructions (e.g., a non-transitory computer-readable medium storing instructions executable by a processor), or any combination thereof for performing the following aspects of the present disclosure:

Aspect 5: The apparatus, including features, circuitry, logic, means, or instructions, or any combination thereof for identifying at least one cell of a memory array, the memory array including a plurality of tiles each tile of the plurality of tiles including a plurality of sub-blocks and a plurality of decks, where each sub-block of the plurality of sub-blocks includes a plurality of memory cells of the memory array addressable via a plurality of word lines and a plurality of bit lines, the plurality of bit lines including a first bit line coupled with a first deck and a second deck of the plurality of decks, a second bit line coupled with a third deck and a fourth deck of the plurality of decks, and a third bit line coupled with a fifth deck and a sixth deck of the plurality of decks and accessing the at least one cell of the memory array using a plurality of bit line decoders positioned beneath the memory array where a first bit line decoder of the plurality of bit line decoders is coupled with the first bit line using a first configuration of sockets within a first subset of the plurality of sub-blocks, a second bit line decoder of the plurality of bit line decoders is coupled with the second bit line using a second configuration of sockets within a second subset of the plurality of sub-blocks, and a third bit line decoder of the plurality of bit line decoders is coupled with the third bit line using a third configuration of sockets within a third subset of the plurality of sub-blocks.

Aspect 6: The apparatus of aspect 5, further including operations, features, circuitry, logic, means, or instructions, or any combination thereof for at least one sub-block of the plurality of sub-blocks includes sockets that couple more than one bit line with a respective bit line decoder of the plurality of bit line decoders.

Aspect 7: The apparatus of aspect 6, further including operations, features, circuitry, logic, means, or instructions, or any combination thereof for the plurality of bit lines further includes a fourth bit line, the fourth bit line coupled with a seventh deck and an eight deck of the plurality of decks, and a fourth bit line decoder of the plurality of bit line decoders is coupled with the fourth bit line using a fourth configuration of sockets.

Aspect 8: The apparatus of aspect 7, further including operations, features, circuitry, logic, means, or instructions, or any combination thereof for a first sub-block of the plurality of sub-blocks includes the first configuration of sockets, the second configuration of sockets, and the fourth configuration of sockets, and a second sub-block of the plurality of sub-blocks includes the first configuration of sockets, the second configuration of sockets, and the third configuration of sockets.

Aspect 9: The apparatus of any of aspects 7 through 8, further including operations, features, circuitry, logic, means, or instructions, or any combination thereof for a first pair of sub-blocks including the first configuration of sockets is separated by a first sub-block including the second configuration of sockets and the fourth configuration of sockets, and a second pair of pair of sub-blocks including the first configuration of sockets is separated by a second sub-block including the second configuration of sockets and the third configuration of sockets.

Aspect 10: The apparatus of any of aspects 5 through 9, further including operations, features, circuitry, logic, means, or instructions, or any combination thereof for a first sub-block of the plurality of sub-blocks includes the first configuration of sockets and the second configuration of sockets, and a second sub-block of the plurality of sub-blocks includes the first configuration of sockets and the third configuration of sockets.

It should be noted that the methods described herein describe possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 11: An apparatus, including: a memory array having a plurality of decks and a plurality of bit lines, each of the plurality of bit lines coupled with one or more decks of the plurality of decks, the plurality of bit lines including a first bit line, a second bit line, and a third bit line; a plurality of bit line decoders positioned beneath the memory array; and a plurality of bit line sockets including a first subset of bit line sockets that are arranged according to a first periodicity and couple respective segments of the first bit line with respective bit line decoders of the plurality of bit line decoders, a second subset of bit line sockets that are arranged according to a second periodicity and couple respective segments of the second bit line with respective bit line decoders of the plurality of bit line decoders, and a third subset of bit line sockets that are arranged according to the second periodicity and couple respective segments of the third bit line with respective bit line decoders of the plurality of bit line decoders.

Aspect 12: The apparatus of aspect 11, where the second periodicity is greater than the first periodicity.

Aspect 13: The apparatus of aspect 12, where each bit line socket of the second subset of bit line sockets intersects each segment of the second bit line between ends of the each segment and each bit line socket of the third subset of bit line sockets intersects each segment of the third bit line between ends of the each segment.

Aspect 14: The apparatus of aspect 13, where each bit line socket of the first subset of bit line sockets intersects each segment of the first bit line between ends of the each segment.

Aspect 15: The apparatus of any of aspects 11 through 14, where the plurality of bit lines further includes a fourth bit line, the fourth bit line coupled with a seventh deck and an eight deck of the plurality of decks.

Aspect 16: The apparatus of aspect 15, where the plurality of bit line sockets further includes a fourth subset of bit line sockets arranged according to the second periodicity that couple respective segments of the fourth bit line with respective bit line decoders of the plurality of bit line decoders.

Aspect 17: The apparatus of aspect 16, where each bit line socket of the third subset of bit line sockets intersects each segment of the third bit line between ends of the segment and each bit line socket of the fourth subset of bit line sockets intersects each segment of the fourth bit line between ends of the segment.

Aspect 18: The apparatus of aspect 17, where each bit line socket of the first subset of bit line sockets intersects each segment of the first bit line between ends of the each segment.

Aspect 19: The apparatus of any of aspects 11 through 18, further including: a plurality of word lines, each of the plurality of word lines coupled with one or more decks of the plurality of decks a plurality of word line decoders positioned beneath the memory array; and a plurality of word line sockets that couple each of the plurality of word lines with a respective word line decoder of the plurality of word line decoders.

Aspect 20: The apparatus of aspect 19, where the plurality of word line sockets includes a first subset of word line sockets arranged according to a third periodicity that couple respective segments of a first word line with respective word line decoders of the plurality of word line decoders and a second subset of word line sockets arranged according to the third periodicity for coupling a second word line to the plurality of word line decoders.

Aspect 21: The apparatus of any of aspects 11 through 20, where the first bit line is coupled with a first deck and a second deck of the plurality of decks, the second bit line is coupled with a third deck and a fourth deck of the plurality of decks, and the third bit line is coupled with a fifth deck and a sixth deck of the plurality of decks.

An apparatus is described. The following provides an overview of aspects of the apparatus as described herein:

Aspect 22: An apparatus, including: a plurality of tiles of a memory array, each tile of the plurality of tiles including a plurality of sub-blocks and a plurality of decks, where each sub-block of the plurality of sub-blocks includes a plurality of memory cells of the memory array addressable via a plurality of word lines and a plurality of bit lines, each of the plurality of bit lines coupled with one or more decks of the plurality of decks, the plurality of bit lines including a first bit line, a second bit line, and a third bit line; a plurality of bit line decoders positioned beneath the memory array, where a first bit line decoder of the plurality of bit line decoders is coupled with the first bit line using a first configuration of sockets within a first subset of the plurality of sub-blocks, a second bit line decoder of the plurality of bit line decoders is coupled with the second bit line using a second configuration of sockets within a second subset of the plurality of sub-blocks, and a third bit line decoder of the plurality of bit line decoders is coupled with the third bit line using a third configuration of sockets within a third subset of the plurality of sub-blocks.

Aspect 23: The apparatus of aspect 22, where at least one sub-block of the plurality of sub-blocks includes sockets that couple more than one bit line with a respective bit line decoder of the plurality of bit line decoders.

Aspect 24: The apparatus of aspect 23, where a first sub-block of the plurality of sub-blocks includes the first configuration of sockets and the second configuration of sockets, and a second sub-block of the plurality of sub-blocks includes the first configuration of sockets and the third configuration of sockets.

Aspect 25: The apparatus of any of aspects 22 through 24, further including: a plurality of word line decoders positioned beneath the memory array, where each of the plurality of word lines are coupled with a respective word line decoder of the plurality of word line decoders using a fourth configuration of the plurality of sub-blocks.

Aspect 26: The apparatus of any of aspects 22 through 25, where the first bit line is coupled with a first deck and a second deck of the plurality of decks, the second bit line is coupled with a third deck and a fourth deck of the plurality of decks, and the third bit line is coupled with a fifth deck and a sixth deck of the plurality of decks.

Aspect 27: The apparatus of any of aspects 22 through 26, where a first pair of sub-blocks including the first configuration of sockets is separated by a first sub-block including the second configuration of sockets, and a second pair of pair of sub-blocks including the first configuration of sockets is separated by a second sub-block including the third configuration of sockets.

Aspect 28: The apparatus of any of aspects 22 through 27, where the plurality of bit lines further includes a fourth bit line, the fourth bit line coupled with a seventh deck and an eighth deck of the plurality of decks, a fourth bit line decoder of the plurality of bit line decoders is coupled with the fourth bit line using a fourth configuration of sockets within a fourth subset of the plurality of sub-blocks.

Aspect 29: The apparatus of aspect 28, where a first sub-block of the plurality of sub-blocks includes the first configuration of sockets, the second configuration of sockets, and the fourth configuration of sockets, and a second sub-block of the plurality of sub-blocks includes the first configuration of sockets, the second configuration of sockets, and the third configuration of sockets.

Aspect 30: The apparatus of any of aspects 28 through 29, where a first pair of sub-blocks including the first configuration of sockets is separated by a first sub-block including the second configuration of sockets and the fourth configuration of sockets, and a second pair of pair of sub-blocks including the first configuration of sockets is separated by a second sub-block including the second configuration of sockets and the third configuration of sockets.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:

a tile of a memory array, the tile of the memory array comprising a plurality of memory cells of the memory array addressable via a plurality of access lines, the plurality of access lines comprising a first access line and a second access line; and a plurality of access line decoders positioned beneath the memory array, wherein a first access line decoder of the plurality of access line decoders is coupled with respective first access line segments of the first access line using a first plurality of sockets located at respective ends of the respective first access line segments and a second access line decoder of the plurality of access line decoders is coupled with respective second access line segments of the second access line using a second plurality of sockets located in respective middle locations of the respective second access line segments.

2. The apparatus of claim 1, wherein the respective ends of the respective first access line segments comprise locations a first distance from respective first ends of the respective first access line segments that is less than a second distance from respective second ends of the respective first access line segments.

3. The apparatus of claim 1, wherein the respective middle locations of the respective second access line segments comprise locations equidistant between respective first ends of the respective second access line segments and respective second ends of the respective second access line segments.

4. The apparatus of claim 1, wherein the respective ends of the respective first access line segments that are farthest from a socket are each located a first distance from a socket of the first plurality of sockets and respective ends of the respective second access line segments that are farthest from a socket are each located the first distance from a socket of the second plurality of sockets.

5. The apparatus of claim 1, wherein the plurality of access lines comprises a third access line, and wherein a third access line decoder of the plurality of access line decoders is coupled with respective third access line segments of the third access line using a third plurality of sockets located in respective middle locations of the respective third access line segments.

6. The apparatus of claim 5, wherein the respective middle locations of the respective third access line segments comprise locations equidistant between respective first ends of the respective third access line segments and respective second ends of the respective third access line segments.

7. The apparatus of claim 1, wherein the respective first access line segments comprise a length shorter than the respective second access line segments.

8. The apparatus of claim 1, wherein the tile of the memory array further comprises a plurality of sub-blocks, wherein each sub-block of the plurality of sub-blocks comprises a subset of the plurality of memory cells.

9. A method, comprising:
identifying at least one cell of a memory array, the memory array comprising a tile comprising a plurality of memory cells of the memory array addressable via a plurality of access lines, the plurality of access lines comprising a first access line and a second access line; and
accessing the at least one cell of the memory array using a plurality of access line decoders positioned beneath the memory array, wherein a first access line decoder of the plurality of access line decoders is coupled with respective first access line segments of the first access line using a first plurality of sockets located at respective ends of the respective first access line segments and a second access line decoder of the plurality of access line decoders is coupled with respective second access line segments of the second access line using a second plurality of sockets located in respective middle locations of the respective second access line segments.

10. The method of claim 9, wherein the respective ends of the respective first access line segments comprise locations a first distance from respective first ends of the respective first access line segments that is less than a second distance from respective second ends of the respective first access line segments.

11. The method of claim 9, wherein the respective middle locations of the respective second access line segments comprise locations equidistant between respective first ends of the respective second access line segments and respective second ends of the respective second access line segments.

12. The method of claim 9, wherein the respective ends of the respective first access line segments that are farthest from a socket are each located a first distance from a socket of the first plurality of sockets and respective ends of the respective second access line segments that are farthest from a socket are each located the first distance from a socket of the second plurality of sockets.

13. The method of claim 9, wherein the plurality of access lines comprises a third access line, and wherein a third access line decoder of the plurality of access line decoders is coupled with respective third access line segments of the third access line using a third plurality of sockets located in respective middle locations of the respective third access line segments.

14. The method of claim 13, wherein the respective middle locations of the respective third access line segments comprise locations equidistant between respective first ends of the respective third access line segments and respective second ends of the respective third access line segments.

15. The method of claim 9, wherein the respective first access line segments comprise a length shorter than the respective second access line segments.

16. The method of claim 9, wherein the respective first access line segments comprise a same length as the respective second access line segments.

17. An apparatus, comprising:
a tile of a memory array, the tile of the memory array comprising a plurality of memory cells of the memory array addressable via a plurality of access lines, the plurality of access lines comprising a first access line and a second access line; and
a plurality of access line decoders positioned beneath the memory array, wherein a first access line decoder of the plurality of access line decoders is coupled with a plurality of first segments of the first access line using a first plurality of sockets, wherein respective ends of the plurality of first segments that are farthest from a socket are each located a first distance from a socket of the first plurality of sockets, wherein a second access line decoder of the plurality of access line decoders is coupled with a plurality of second segments of the second access line using a second plurality of sockets, wherein respective ends of the plurality of second segments that are farthest from a socket are each located the first distance from a socket of the second plurality of sockets, and wherein respective lengths of the plurality of first segments are different from respective lengths of the plurality of second segments.

18. The apparatus of claim 17, wherein the plurality of access lines comprises a third access line, and wherein a third access line decoder of the plurality of access line decoders is coupled with a plurality of third segments of the third access line using a third plurality of sockets, wherein respective ends of the plurality of third segments that are farthest from a socket are each located the first distance from a socket of the third plurality of sockets.

19. The apparatus of claim 18, wherein respective lengths of the plurality of third segments are different from respective lengths of the plurality of first segments.

20. The apparatus of claim 18, wherein respective lengths of the plurality of third segments are different from respective lengths of the plurality of second segments.

* * * * *